United States Patent
Endo et al.

(10) Patent No.: US 9,911,526 B2
(45) Date of Patent: Mar. 6, 2018

(54) MAGNET UNIT AND MAGNETRON SPUTTERING APPARATUS

(71) Applicant: CANON ANELVA CORPORATION, Kawasaki-shi (JP)

(72) Inventors: Tetsuya Endo, Komae (JP); Einstein Noel Abarra, Hachioji (JP)

(73) Assignee: CANON ANELVA CORPORATION, Kawasaki-shi (JP)

( * ) Notice: Subject to any disclaimer, the term of this patent is extended or adjusted under 35 U.S.C. 154(b) by 423 days.

(21) Appl. No.: 14/696,909

(22) Filed: Apr. 27, 2015

(65) Prior Publication Data

US 2015/0235751 A1    Aug. 20, 2015

Related U.S. Application Data

(62) Division of application No. 13/328,793, filed on Dec. 16, 2011, now Pat. No. 9,058,962.

(30) Foreign Application Priority Data

Dec. 27, 2010  (JP) .................................. 2010-291235
Sep. 21, 2011  (JP) .................................. 2011-205736

(51) Int. Cl.
   *H01J 37/34*    (2006.01)
   *H01F 7/02*     (2006.01)
(52) U.S. Cl.
   CPC .......... *H01F 7/0273* (2013.01); *H01J 37/345* (2013.01); *H01J 2237/3322* (2013.01)
(58) Field of Classification Search
   CPC .... H01J 37/345; H01J 37/3452; H01J 37/347; H01F 7/0278

USPC ............... 204/298.16, 298.17, 298.19, 298.2
See application file for complete search history.

(56) References Cited

U.S. PATENT DOCUMENTS

| | | | |
|---|---|---|---|
| 7,531,071 B2 | 5/2009 | Deppisch et al. |
| 7,785,449 B2 | 8/2010 | Endo et al. |
| 8,500,975 B2 | 8/2013 | Le et al. |
| 2007/0175748 A1 | 8/2007 | Atamny et al. |
| 2008/0296142 A1 | 12/2008 | Le et al. |
| 2009/0277779 A1 | 11/2009 | Sasaki |
| 2010/0126848 A1 | 5/2010 | Ohmi et al. |
| 2011/0297537 A1 | 12/2011 | Endo et al. |

FOREIGN PATENT DOCUMENTS

| JP | 63-317671 A | 12/1988 |
|---|---|---|
| JP | 5-148642 A | 6/1993 |
| JP | 2000-309867 A | 11/2000 |
| JP | 2001-348663 A | 12/2001 |
| JP | 4175242 A | 11/2008 |
| JP | 4175242 B2 | 11/2008 |

*Primary Examiner* — Rodney G McDonald
(74) *Attorney, Agent, or Firm* — Fitzpatrick, Cella, Harper & Scinto

(57) ABSTRACT

A magnet unit has a first magnet element and a second magnet element. The first magnet element includes a first magnet which is provided to stand upright on a yoke plate, a second magnet which is provided to stand upright on the yoke plate and has a magnetic pole unlike the first magnet, and a third magnet which is provided with a tilt between the first magnet and the second magnet. The second magnet element includes a fourth magnet which is provided to stand upright on the yoke plate, a fifth magnet which is arranged to stand upright on the yoke plate and has a magnetic pole unlike the fourth magnet, and a sixth magnet which is provided with a tilt between the fourth magnet and the fifth magnet. The first magnet element and the second magnet element are alternately arranged in an endless shape.

8 Claims, 24 Drawing Sheets

SPUTTERING APPARATUS USING CIRCULAR CATHODE

F I G. 10
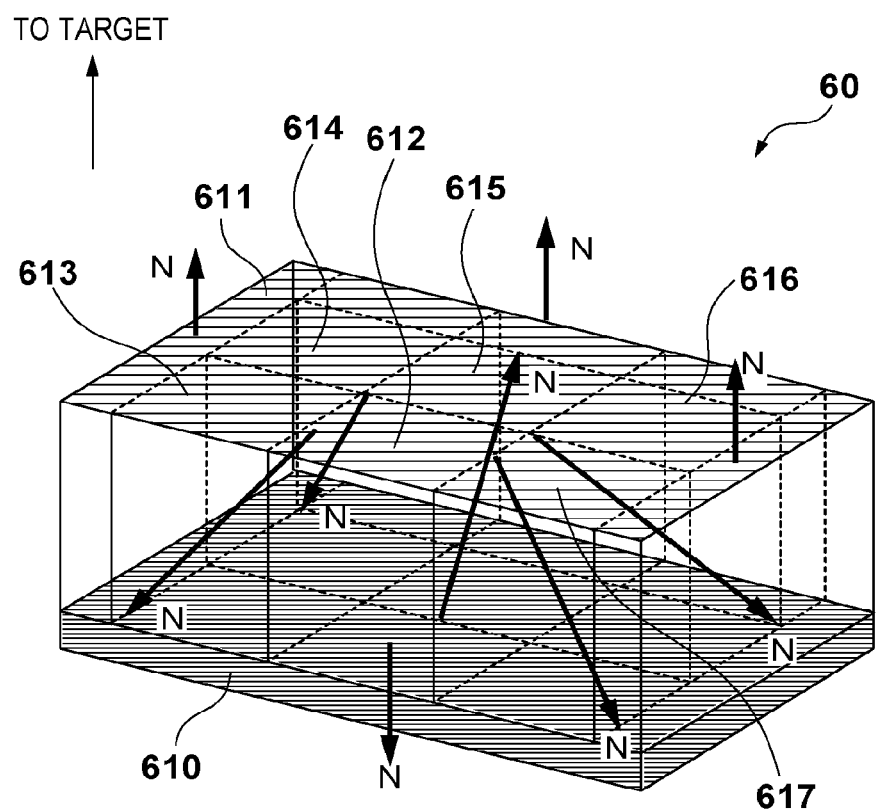

FIG. 11A    FIG. 11B
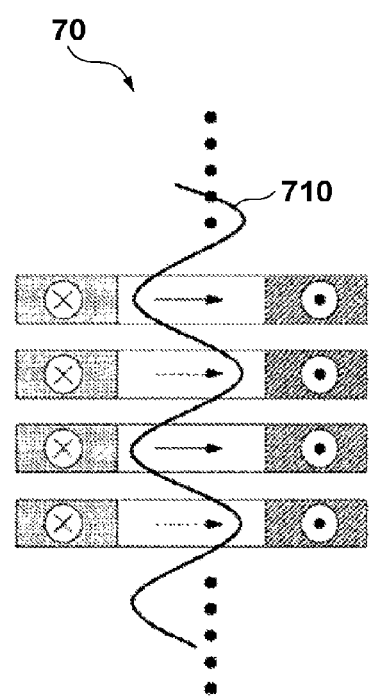
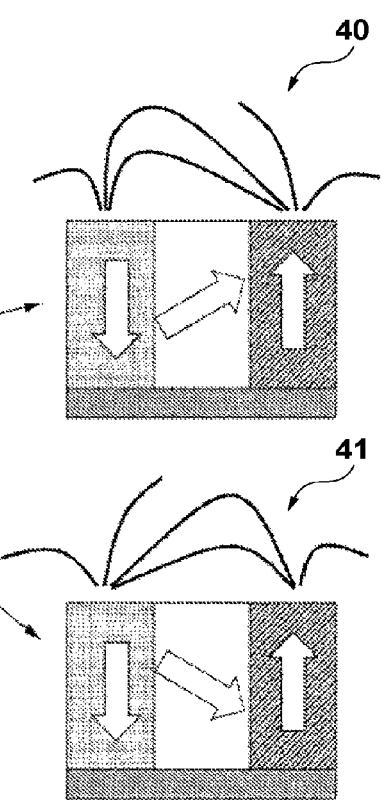
FIG. 11C

F I G. 16
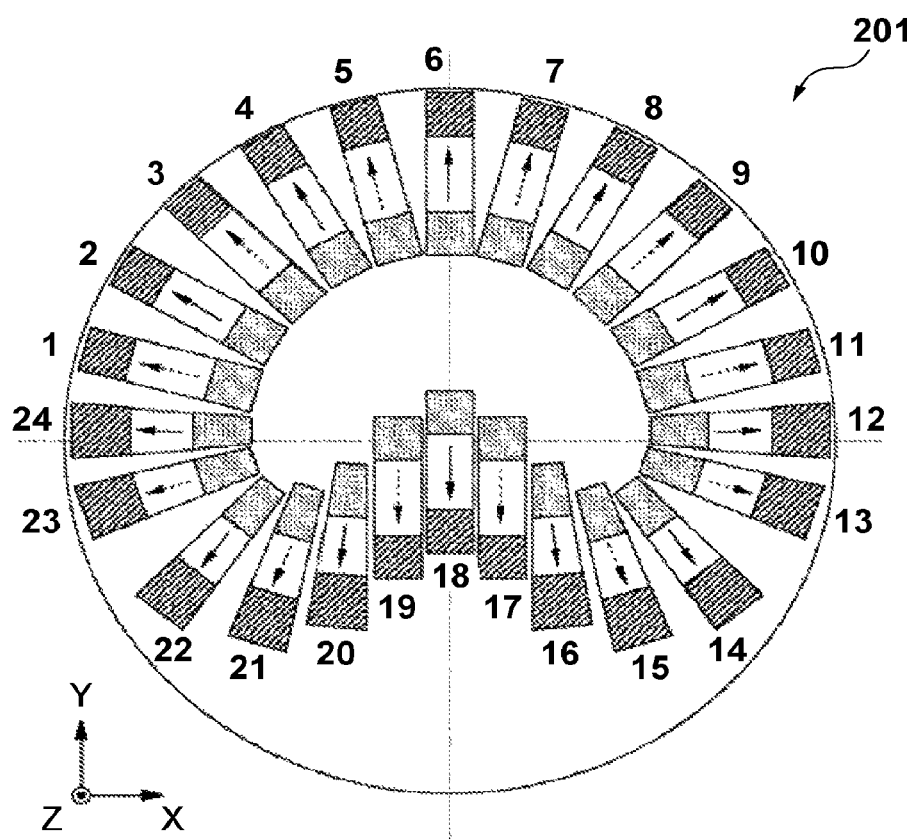
MAGNET ELEMENT 40-2,4,6,8,10,18
MAGNET ELEMENT 41-1,3,5,7,9,11,17,19
MAGNET ELEMENT 50-12,14,16,20,22,24
MAGNET ELEMENT 51-13,15,21,23

F I G. 17A
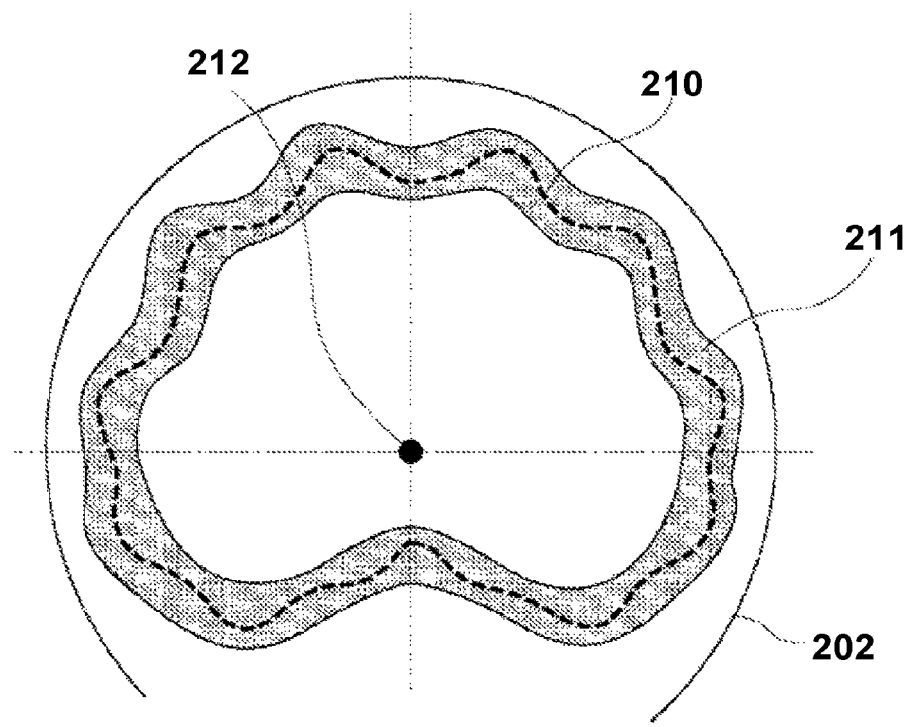
F I G. 17B
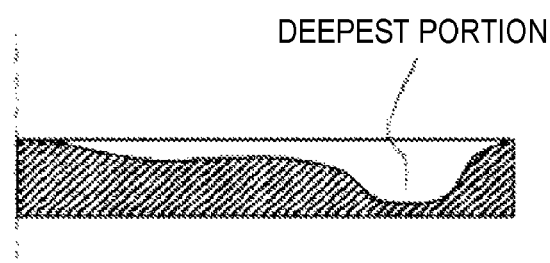

F I G. 18A
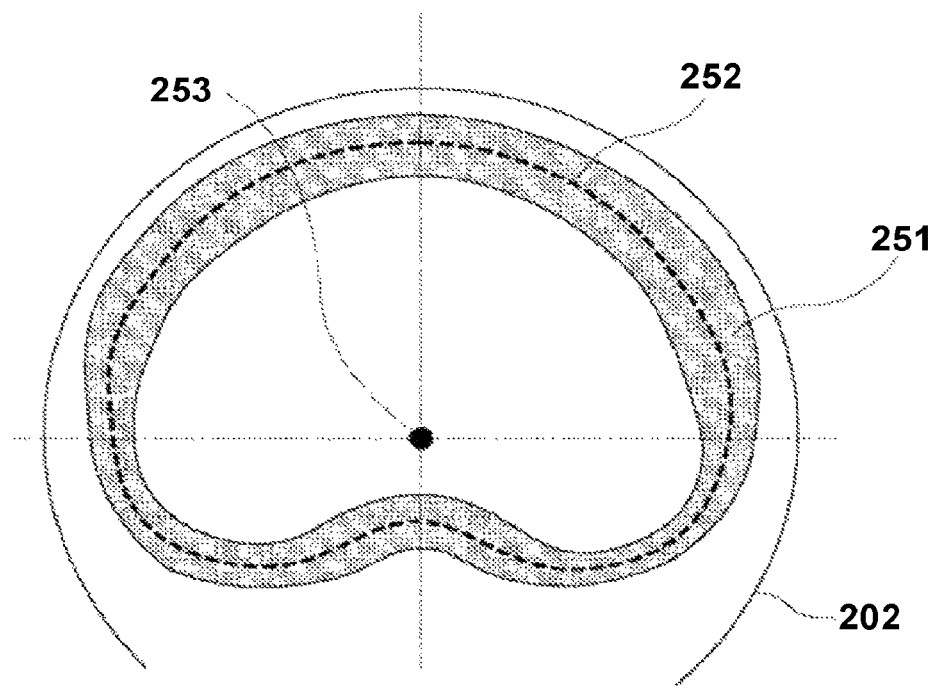
F I G. 18B
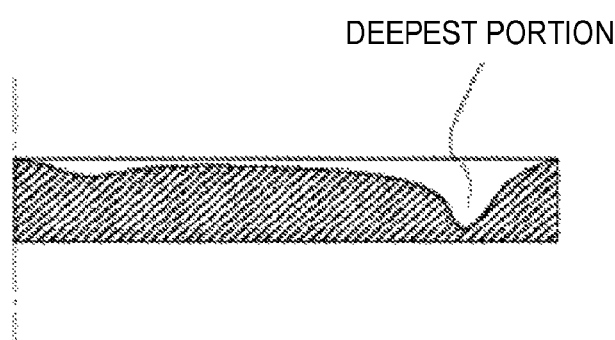

F I G. 20A
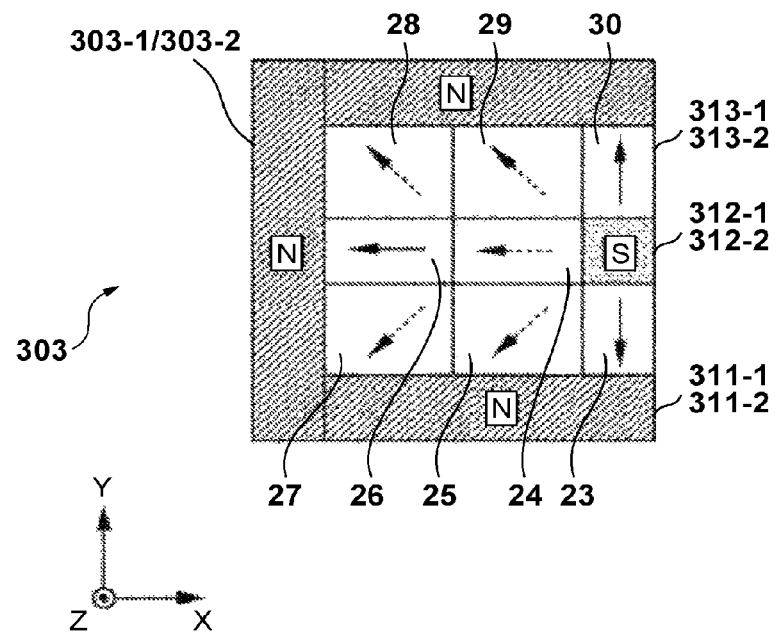
F I G. 20B
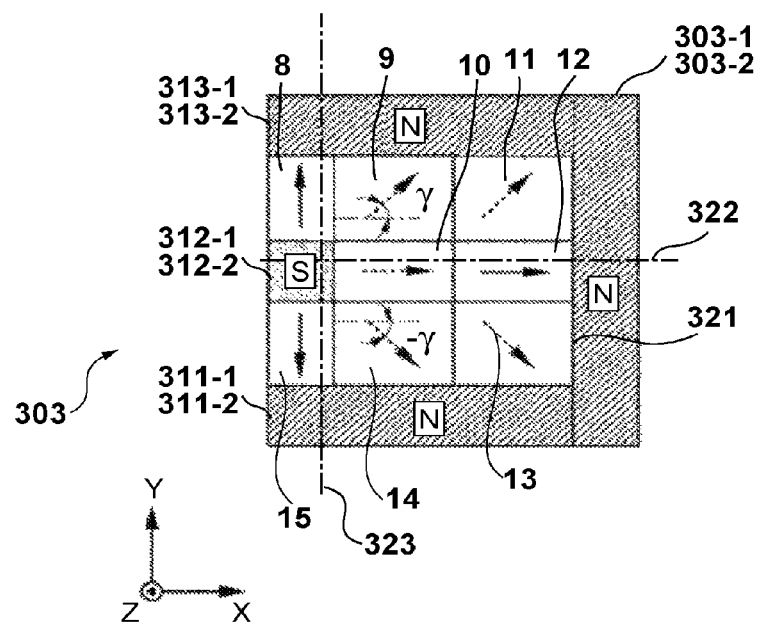

F I G. 22A
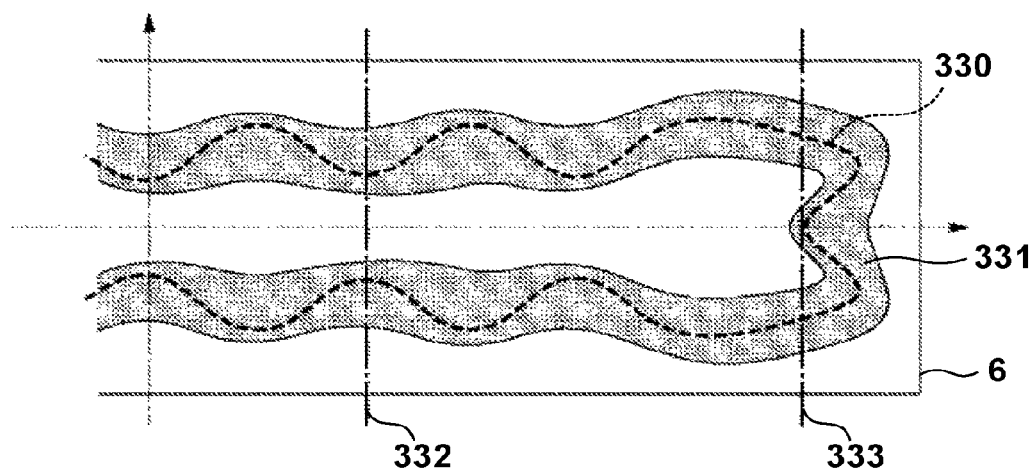
F I G. 22B     F I G. 22C
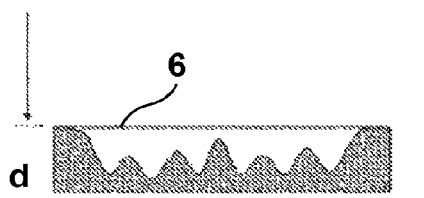
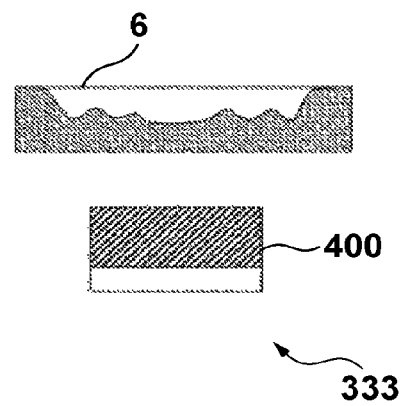

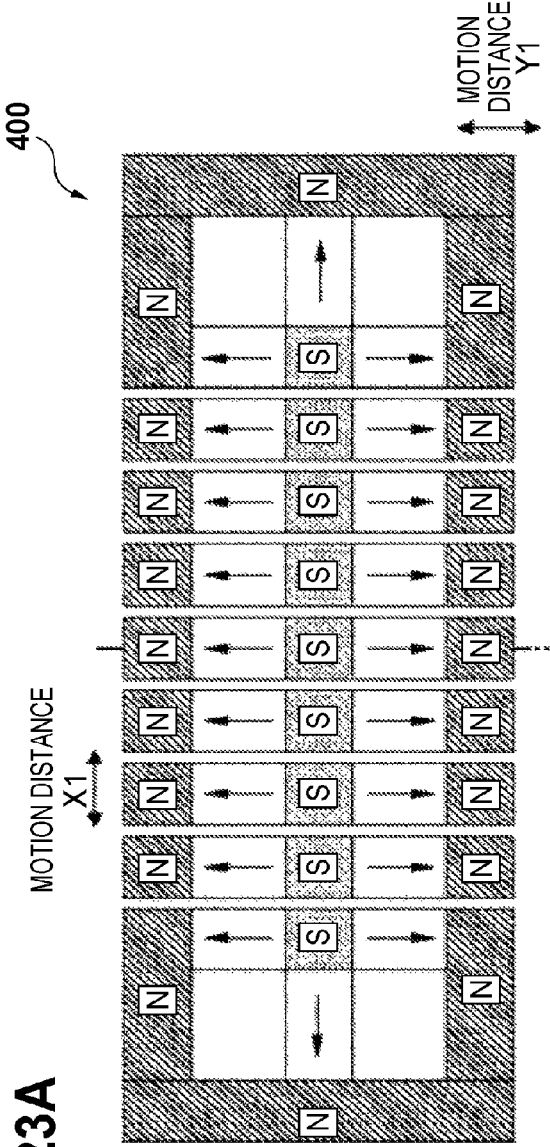
F I G. 23A
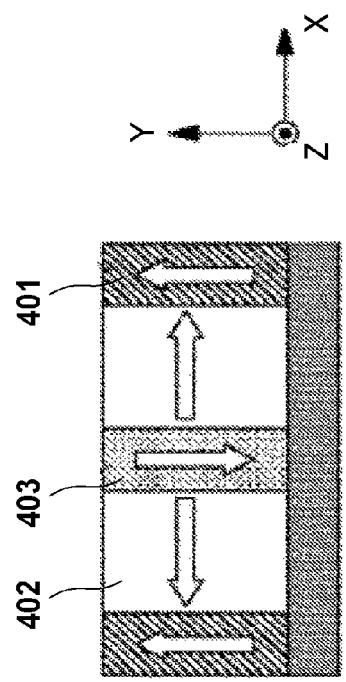
F I G. 23B

F I G. 27
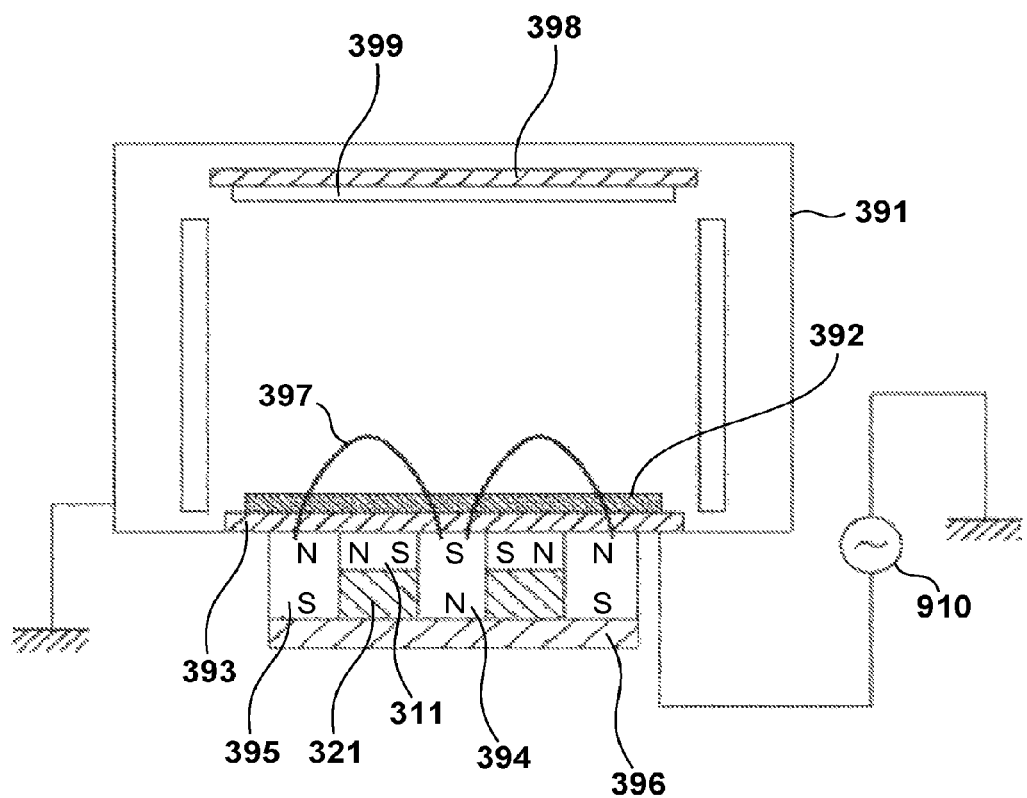

MAGNET UNIT AND MAGNETRON SPUTTERING APPARATUS

The present application is a divisional of U.S. application Ser. No. 13/328,793, filed on Dec. 16, 2011, which claims priority to JP 2010-291235, filed Dec. 27, 2010, and JP 2011-205736, filed Sep. 21, 2011, the entire disclosure of each of which is incorporated by reference herein.

BACKGROUND OF THE INVENTION

Field of the Invention

The present invention relates to a magnet unit and a magnetron sputtering apparatus and, more particularly, to an improvement in the structure of a magnet unit arranged on the rear surface side of a cathode electrode supporting a sputtering target and a magnetron sputtering apparatus having the magnet unit.

Description of the Related Art

A sputtering process used in deposition in the semiconductor industry can deposit a film of any material including, for example, a refractory material such as platinum and tungsten, or an insulating material such as $SiO_2$. In addition, it is easy to change the energy of sputtering particles, and it is also possible to control, for example, the crystalline characteristics, magnetic characteristics, insulation characteristics, and stress of a film.

A sputtering cathode used in the sputtering process adopts the following principles. A cathode magnet is arranged in the atmosphere behind a target arranged in a vacuum, with a partition (for example, a back plate) between them. Magnetic lines of force formed by the cathode magnet generate a magnetic tunnel that forms an endless annular trajectory on the flat surface of the target (note that a set of points at which a component, perpendicular to the flat surface of the target, of the magnetic tunnel is zero will be referred to as a "magnetic track"). In this state, supplying a power to the target generates an electric field in the direction of the normal to the surface of the target. Electrons are confined in a region created when the magnetic field and the electric field intersect at right angles. When the confined electrons collide against gas atoms many times, the gas atoms turn into ions. The electric field on the front surface of the target accelerates the ions, thereby causing sputtering.

Since the ions sputter the atoms on the target surface, the target surface erodes (to be referred to as "erosion") over the use time. When the depth of erosion gets close to the thickness of the target, the target needs to be exchanged with a new one. If erosion concentrates on a certain position and the erosion speed becomes high, the target exchange frequency also becomes high, thereby decreasing the availability of a sputtering apparatus. On the other hand, if the use efficiency of the target is high and the erosion speed is low, the target exchange frequency is low, thereby increasing the availability of a sputtering apparatus.

The erosion speed changes depending on factors such as an electric field strength and a magnetic flux density generated on the front surface of the target, a sputtering gas pressure, and a magnetic track shape. The erosion often selectively proceeds in a partial region (partial diameter) of the target surface, thereby raising the erosion speed.

To reduce a concentration of erosion, a magnetic track shape, that is, a cathode magnet shape (magnetic circuit) has been mainly improved, for which many techniques have been proposed. It is, however, difficult for a linear plasma generated on a magnetic track to erode the whole wide flat surface of the target evenly. Therefore, a method of eroding the whole flat surface of the target by rotating or swinging (performing reciprocation for) the magnetic track (cathode magnet) is used.

Japanese Patent Laid-Open No. 63-317671 proposes a cathode magnet in which, as shown in FIG. 25, a second magnetic apparatus 133 is arranged between the N and S poles of a first magnetic apparatus 131 provided on the rear surface of a target, and the N and S poles of the second magnetic apparatus 133 are alternately arranged, in the extending direction of the N and S poles of the first magnetic apparatus 131, to be spaced apart from each other and to face the surface side of the target. Note that reference numeral 151 in FIG. 25 denotes the centrode of an electron e.

In Japanese Patent Laid-Open No. 2001-348663, as shown in FIG. 26, there are provided a backing plate which is connected with a power supply and has a function as a cathode electrode, a target attached on the surface of the backing plate, and a magnetic circuit arranged on the rear surface of the backing plate to face the target. The magnetic circuit is arranged so that an erosion region A appearing on the surface of a target 281 is made into meandering closed curves.

In Japanese Patent No. 4175242, as shown in FIG. 27, there is proposed a magnetron sputtering apparatus in which a target 392 is arranged in a vacuum chamber 391. The apparatus includes, on the rear surface of the target, an inner magnet 394, an outer magnet 395 which has a magnetization direction opposite to that of the inner magnet 394 and surrounds the inner magnet 394, and a yoke 396 arranged to face the target 392 and to sandwich the inner and outer magnets therebetween, and further includes a magnetic circuit for generating arcuate magnetic lines of force 397 on the surface of the target 392. Moreover, a horizontal magnet 311 which has a magnetization component that repels those of the outer magnet 395 and inner magnet 394 is inserted between the outer magnet 395 and inner magnet 394 to be parallel to the surface of the target 392.

In the methods proposed in Japanese Patent Laid-Open Nos. 63-317671 and 2001-348663, the magnetic circuit of the cathode magnet arranged behind the target is formed into a wavy shape, thereby improving the use efficiency of the target while preventing sputtering particles from adhering again on the target and also preventing a concentration of erosion.

If, however, the second magnetic apparatus 133 is arranged within the first magnetic apparatus 131 as in Japanese Patent Laid-Open No. 63-317671 (FIG. 25), the S- and N poles are close to each other. That is, magnetic lines of force close directly above the cathode magnet, and they do not appear on the surface of the target. As a result, a magnetic field does not appear on the target. If the S- and N poles of the second magnetic apparatus 133 are moved away from the S- and N poles of the first magnetic apparatus 131, magnetic lines of force never close directly above the cathode magnet, and a magnetic field appears on the target. The method, however, increases the size of the first magnetic apparatus 131, and then the cathode becomes large.

On the other hand, in the structure in which an outer magnet 221 surrounds a meandering inner magnet 220 with some distance as in Japanese Patent Laid-Open No. 2001-348663 (FIG. 26), the width of the outer magnet 221 which is interlocked with the curved portion of the inner magnet 220 is limited. That is, as the width of the curved portion of the inner magnet 220 becomes large, the width of the outer magnet 221 becomes small. Consequently, the magnetic field of the curved portion weakens, and the meander width of the magnetic track becomes small. Furthermore, if a region A is filled with magnets to reserve the meander width, it is possible to widen the meander width but the magnetic field strength becomes locally high, and erosion locally proceeds quickly, which makes the meandering form meaningless.

In Japanese Patent No. 4175242 (FIG. 27), since the horizontal magnet 311 is arranged between the outer magnet 395 and the inner magnet 394 to be parallel to the surface of the target 392, the magnetic flux densities of the outer magnet 395 and inner magnet 394 are equal to each other. Therefore, it is impossible to form a wavy magnetic circuit.

SUMMARY OF THE INVENTION

To solve the above problems, the present invention provides a magnet unit and a magnetron sputtering apparatus which can generate a wavy magnetic track on a target with a sufficient magnetic field strength.

According to one aspect of the present invention, there is provided a magnet unit which includes, on a rear surface of a cathode electrode supporting a target, a yoke plate made of an antiferromagnetic plate material, outer peripheral magnets arranged on a plate surface of the yoke plate, and inner magnets that are arranged inside the outer peripheral magnets on the plate surface of the yoke plate and have polarities different from polarities of the outer peripheral magnets, and forms a magnetic track as a set of regions where tangents of magnetic lines of force generated on the target by the outer peripheral magnets and the inner magnets are parallel to a surface of the target, the unit comprising:

a first magnet element including (a) a first magnet which is provided to stand upright on the plate surface of the yoke plate along a vertical direction and has a first magnetic pole on a surface facing the plate surface of the yoke plate and a second magnetic pole unlike the first magnetic pole on a surface facing away from the plate surface of the yoke plate, (b) a second magnet which is provided to stand upright on the plate surface of the yoke plate along the vertical direction and has a third magnetic pole unlike the first magnetic pole on a surface facing the plate surface of the yoke plate and a fourth magnetic pole unlike the second pole on the surface facing away from the plate surface of the yoke plate, and (c) a third magnet which is arranged to stand upright between the first magnet and the second magnet, has a fifth magnetic pole in a portion facing the second magnetic pole of the first magnet and a sixth magnetic pole unlike the fifth pole on a portion facing the third magnetic pole of the second magnet, and is magnetized so that a line which connects the fifth magnetic pole and the sixth magnetic pole is diagonally oriented with respect to the flat plate surface of the yoke plate; and a second magnet element including (d) a fourth magnet which is provided to stand upright on the plate surface of the yoke plate along the vertical direction and has a seventh magnetic pole on the surface facing the plate surface of the yoke plate and an eighth magnetic pole unlike the seventh magnetic pole on the surface facing away from the plate surface of the yoke plate, (e) a fifth magnet which is provided to stand upright on the plate surface of the yoke plate along the vertical direction and has a ninth magnetic pole unlike the seventh magnetic pole on the surface facing the plate surface of the yoke plate and a 10th magnetic pole unlike the eighth pole on the surface facing away from the plate surface of the yoke plate, and (f) a sixth magnet which is arranged to stand upright between the fourth magnet and the fifth magnet, has an 11th magnetic pole in a portion facing the seventh magnetic pole of the fourth magnet and a 12th magnetic pole unlike the 11th pole in a portion facing the 10th magnetic pole of the fifth magnet, and is magnetized so that a line which connects the 11th magnetic pole and the 12th magnetic pole is tilted with respect to the flat plate surface of the yoke plate, wherein the first magnet element and the second magnet element are alternately arranged in an endless shape.

According to another aspect of the present invention, there is provided a magnet unit which includes, on a rear surface of a rectangular cathode electrode supporting a rectangular target, a rectangular yoke plate made of an antiferromagnetic plate material, outer peripheral magnets arranged on the yoke plate, and inner magnets that are arranged inside the outer peripheral magnets on the yoke plate and have polarities different from polarities of the outer peripheral magnets, and forms a magnetic track as a set of regions where tangents of magnetic lines of force generated on the target by the outer peripheral magnets and the inner magnets are parallel to a surface of the target, the unit comprising:

a first magnet group including a plurality of first magnet-group magnets arranged along the periphery of the rectangular yoke plate;

a second magnet group including a plurality of second magnet-group magnets arranged in a center portion of the rectangular yoke plate; and a third magnet group including a plurality of third magnet-group magnets arranged between the first magnet group and the second magnet group to surround the second magnet group, wherein the first magnet-group magnets are provided to stand upright on a plate surface of the yoke plate along a vertical direction, and have the 13th magnetic pole on a surface facing the plate surface of the yoke plate and the 14th magnetic pole unlike the 13th magnetic pole on a surface facing away from the plate surface of the yoke plate, the second magnet-group magnets are provided to stand upright on the plate surface of the yoke plate along the vertical direction, and have the 15th magnetic pole unlike the 13th magnetic pole on the surface facing the plate surface of the yoke plate and the 16th magnetic pole unlike the 14th magnetic pole on the surface facing away from the plate surface of the yoke plate, and the third magnet-group magnets include a seventh magnet which is arranged to stand upright between the first magnet-group magnet and the second magnet-group magnet, has a 17th magnetic pole in a portion facing the 14th magnetic pole of the first magnet-group magnet and an 18th magnetic pole unlike the 17th magnetic pole in a portion facing the 15th magnetic pole of the second magnet-group magnet, and is magnetized so that a line which connects the 17th magnetic pole and the 18th magnetic pole is tilted with respect to the flat plate surface of the yoke, and an eighth magnet which is arranged to stand upright between the first magnet-group magnet and the second magnet-group magnet, has a 19th magnetic pole in a portion facing the 13th magnetic pole of the first magnet-group magnet and a 20th magnetic pole unlike the 19th magnetic pole in a portion facing the 16th magnetic pole of the second magnet-group magnet, and is magnetized so that a line which connects the 19th magnetic pole and the 20th magnetic pole is tilted with respect to the flat plate surface of the yoke.

According to still another aspect of the present invention, there is provided a magnetron sputtering apparatus comprising:

a stage capable of supporting a substrate to be processed;

a cathode electrode which is arranged to face the stage, supports a target, and is supplied with a discharge power; and a transport mechanism for transporting the stage to the front of the target, wherein a magnet unit as described above is arranged on a rear surface of the cathode electrode.

According to the present invention, by alternately arranging a first magnet element and a second magnet element in an endless shape, it is possible to supply an endless meandering magnetic track on the surface of a target.

According to the present invention, using a first magnet group provided along the periphery of a rectangular yoke plate, a second magnet group provided in a center portion of the rectangular yoke plate, and the third magnet group provided between the first magnet group and the second magnet group to surround the second magnet group, it is possible to supply a meandering magnetic track on the surface of a rectangular target.

According to the present invention, it is possible to process a substrate while forming an endless meandering magnetic track on the surface of a target.

Further features of the present invention will become apparent from the following description of exemplary embodiments (with reference to the attached drawings).

BRIEF DESCRIPTION OF THE DRAWINGS

FIG. 10 is a perspective view showing the fifth magnet element according to the present invention;

FIGS. 11A to 11C are schematic views showing a first magnet unit according to the present invention;

FIG. 16 is a schematic view showing a fifth magnet unit according to the present invention;

FIG. 17A is a schematic view showing a result of extracting a magnetic track by the fifth magnet unit according to the present invention;

FIG. 17B is a schematic view showing a result of examining an erosion distribution on a target by the fifth magnet unit according to the present invention;

FIG. 18A is a schematic view showing a result of extracting a magnetic track by a Comparative Example 1 magnet unit;

FIG. 18B is a schematic view showing a result of examining an erosion distribution on a target by the Comparative Example 1 magnet unit;

FIGS. 20A and 20B are plan views showing an eighth magnet element according to the present invention;

FIG. 22A is a schematic view showing a result of extracting a magnetic track by the sixth magnet unit according to the present invention;

FIGS. 22B and 22C are schematic views showing a result of examining an erosion distribution on a target by the sixth magnet unit according to the present invention;

FIGS. 23A and 23B are schematic views showing a Comparative Example 2 magnet unit;

FIG. 27 is a sectional view showing the arrangement of a magnetron sputtering apparatus according to the prior art (Japanese Patent No. 4175242).

DESCRIPTION OF THE EMBODIMENTS

Embodiments of the present invention will be described below with reference to the accompanying drawings. The present invention, however, is not limited to them.

Figure 1:
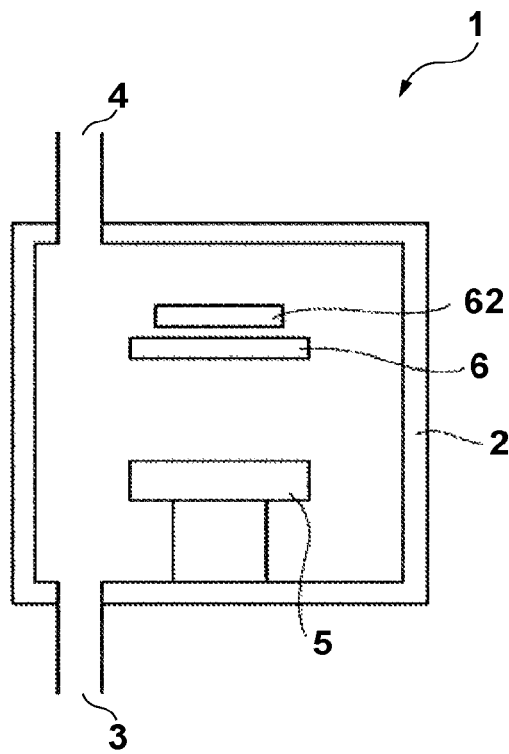
FIG. 1 is a schematic view showing the schematic arrangement of a magnetron sputtering apparatus according to the present invention.
Figure 2:
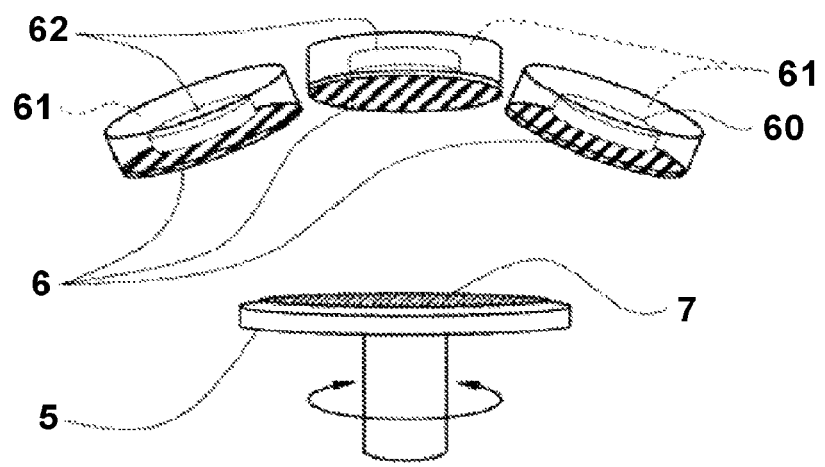
FIG. 2 is a schematic view showing an example of a sputtering apparatus having a mechanism for performing deposition by a circular cathode, which is applicable to the present invention.
Figure 3:
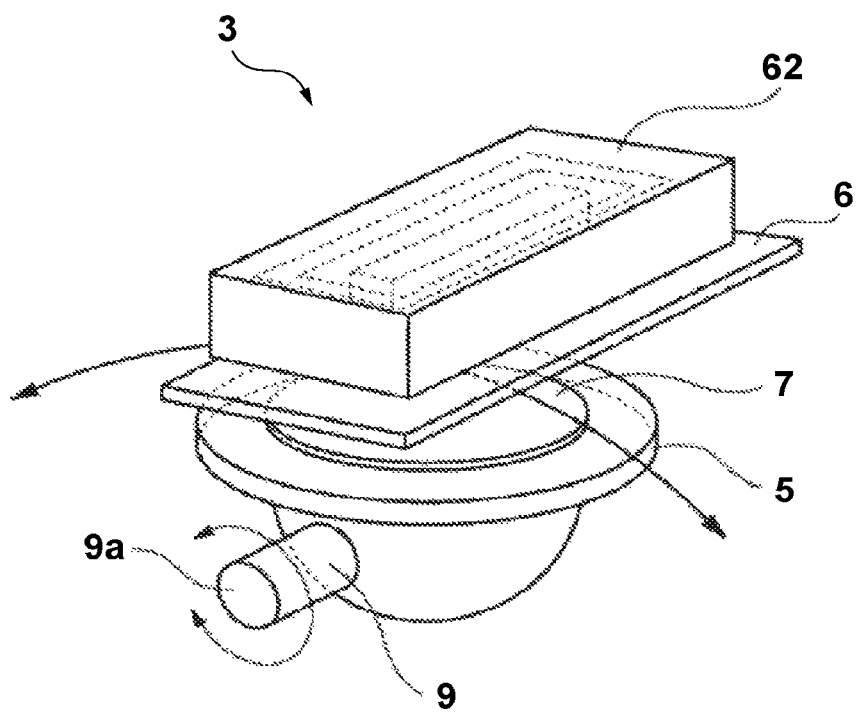
FIG. 3 is a schematic view showing an example of a sputtering apparatus having a mechanism for causing a substrate to pass through, which is applicable to the present invention.

A magnetron sputtering apparatus according to the present invention will be explained with reference to FIG. 1. A magnetron sputtering apparatus 1 (to be referred to as a "sputtering apparatus" hereinafter) according to an embodiment serves as an apparatus which is mounted with a magnet unit 62 (to be described later). FIG. 1 is a schematic view showing the schematic arrangement of the sputtering apparatus according to the present invention. FIG. 2 is a schematic view showing an example of a sputtering apparatus having a mechanism for performing deposition by a circular cathode while rotating a substrate. FIG. 3 is a schematic view showing an example of a sputtering apparatus having a mechanism for causing a substrate to pass through.

As shown in FIG. 1, the sputtering apparatus 1 of the embodiment includes a vacuum chamber 2 for partitioning a processing chamber which can be evacuated. An exhaust port 3 of the vacuum chamber 2 is connected with an exhaust system such as a vacuum pump via a conductance valve (not shown) or the like. The vacuum chamber 2 is connected with a gas introducing system 4 having a flow controller as a process gas introducing means, which supplies a process gas at a predetermined flow rate. As the process gas, a rare gas such as argon (Ar), or a single or mixed gas containing nitrogen (N$_2$) or the like can be used. The vacuum chamber 2 includes a stage 5 for supporting a substrate, and a cathode electrode (not shown) which is arranged to face the substrate and supports a target 6 on its front surface.

The target 6 supported on the front surface of a cathode electrode 61 shown in FIG. 2 can be made of a single component such as tantalum (Ta), copper (Cu), or titanium (Ti), or a composition containing two or more components, such as GeSbTe, NiFe, CoPt, or FeCo. The target 6 may be made of a non-magnetic material such as Ta or Cu, or a magnetic material such as NiFe, CoPt, or FeCo. The target 6 of this embodiment is formed by, for example, a disk-like plate material or rectangular plate material, and is joined to the front surface (lower surface) of the main body of the cathode electrode.

The cathode electrode 61 is connected with a DC power supply capable of performing power control, or a high-frequency power supply capable of performing power control via a matching unit (neither of which are shown). The magnet unit 62 is arranged on the rear surface of the cathode electrode 61, and can form high-density plasma. That is, the sputtering apparatus 1 of this embodiment introduces a process gas into the processing chamber within the vacuum chamber 2, causes the power supply to generate an electric field on the surface of the target 6, and causes the magnet unit 62 to form a magnetic field on the surface of the target 6. With this processing, the sputtering apparatus 1 generates a plasma on the front surface of the target 6 to deposit, on a substrate 7, a thin film made of the material of the target 6. The plasma may of course be generated by pulse discharge or the like. Note that the detailed arrangement of the magnet unit 62 will be described later.

FIG. 2 shows a case in which a plurality of cathode electrodes 61 are arranged to face the stage 5. In this example, a plurality of cathode electrodes 61 is arranged. The cathode electrodes 61 are tilted with respect to the surface of the stage 5 (or substrate 7). The number of cathode electrodes 61 may be one, as a matter of course. The cathode electrodes 61 may be arranged to be parallel to the surface of the stage 5 (or substrate 7). Furthermore, the central axis of the stage 5 may or may not coincide with that of the cathode electrode.

The sputtering apparatus 1 can simultaneously perform sputtering and substrate rotation. The stage 5 may incorporate a heating mechanism (not shown) such as a heater or a cooling mechanism (not shown) such as a refrigerator.

An example of the substrate 7 includes a semiconductor wafer. The substrate is solely fixed on the stage 5 or a tray mounted with the substrate is fixed on the stage 5.

As shown in FIG. 3, there may be arranged a substrate transport mechanism 9 including a stage rotating mechanism for rotating, along a circle having the mounting surface of the stage 5 as its tangent, the circular stage 5 supporting the substrate 7. In this arrangement example, the stage 5 has a rotation axis 9a extending in the longitudinal direction of the rectangular target 6. The substrate 7 passes through in front of the target 6 by rotating the stage 5 about the rotation axis 9a. The magnet unit 62 is arranged on the rear surface of the cathode electrode, and can form a high-density plasma. Note that the detailed arrangement of the magnet unit 62 will be described later.

The first feature of a magnet unit according to this embodiment is that a first magnet element 40 includes a first magnet which is provided to stand upright on the plate surface of a yoke plate (magnetic plate) along the vertical direction and has a first magnetic pole (N or S pole) on a surface facing the plate surface of the yoke plate (magnetic plate) and a second magnetic pole (N or S pole) unlike the first magnetic pole on a surface (the target side) facing away from the plate surface of the yoke plate (magnetic plate), a second magnet which is provided to stand upright on the plate surface of the yoke plate (magnetic plate) along the vertical direction and has a third magnetic pole (N or S pole) unlike the first magnetic pole (N or S pole) on the surface facing the plate surface of the yoke plate (magnetic plate) and a fourth magnetic pole (N or S pole) unlike the second pole (N or S pole) on the surface (the target side) facing away from the plate surface of the yoke plate (magnetic plate), and a third magnet which is arranged to stand upright between the first magnet and the second magnet, has a fifth magnetic pole (N or S pole) in a portion facing the second magnetic pole (N or S pole) of the first magnet and a sixth magnetic pole (N or S pole) unlike the fifth pole (N or S pole) on a portion facing the third magnetic pole (N or S pole) of the second magnet, and is magnetized so that a line which connects the fifth magnetic pole (N or S pole) and the sixth magnetic pole (N or S pole) is tilted with respect to the flat plate surface of the yoke plate (magnetic plate). The first magnet element 40 will be described in detail later.

The second feature of the magnet unit according to this embodiment is that a second magnet element 41 includes a fourth magnet which is provided to stand upright on the plate surface of a yoke plate (magnetic plate) along the vertical direction and has a seventh magnetic pole (N or S pole) on a surface facing the plate surface of the yoke plate (magnetic plate) and an eighth magnetic pole (N or S pole) unlike the seventh magnetic pole (N or S pole) on a surface (the target side) facing away from the plate surface of the yoke plate (magnetic plate), a fifth magnet which is provided to stand upright on the plate surface of the yoke plate (magnetic plate) along the vertical direction and has a ninth magnetic pole (N or S pole) unlike the seventh magnetic pole (N or S pole) on the surface facing the plate surface of the yoke plate (magnetic plate) and a 10th magnetic pole (N or S pole) unlike the eighth pole (N or S pole) on the surface (the target side) facing away from the plate surface of the yoke plate (magnetic plate), and a sixth magnet which is arranged to stand upright between the fourth magnet and the fifth magnet, has an 11th magnetic pole (N or S pole) in a portion facing the seventh magnetic pole (N or S pole) of the fourth magnet and a 12th magnetic pole (N or S pole) unlike the 11th magnetic pole (N or S pole) in a portion facing the 10th magnetic pole (N or S pole) of the fifth magnet, and is magnetized so that a line which connects the 10th magnetic pole (N or S pole) and the 11th magnetic pole (N or S pole) is tilted with respect to the flat plate surface of the yoke plate (magnetic plate). The second magnet element 41 will be described in detail later.

The third feature of the magnet unit according to this embodiment is that the first magnet element and the second magnet element are alternately arranged in an endless shape. A first magnet unit 70 (FIGS. 11A to 11C), a second magnet unit 80 (FIG. 12), a third magnet unit 90 (FIG. 13), and a fourth magnet unit 100 (FIG. 14) each of which is formed by alternately arranging the first magnet element and the second magnet element will be described in detail later.

Figure 4A:
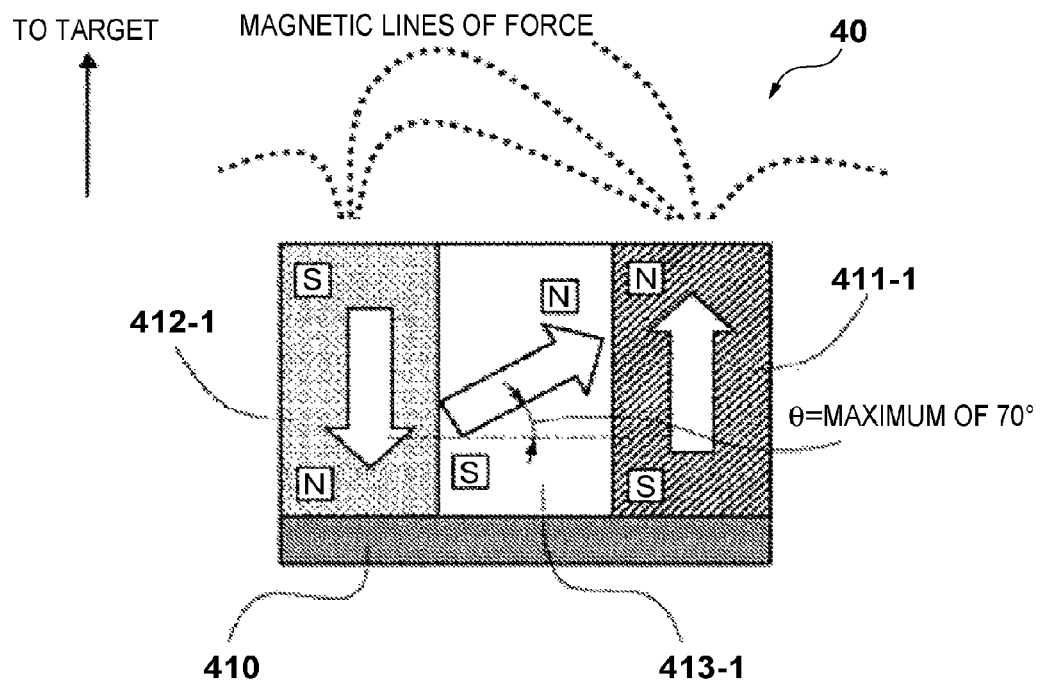
FIGS. 4A and 4B are schematic views showing a first magnet element according to the present invention.
Figure 4B:
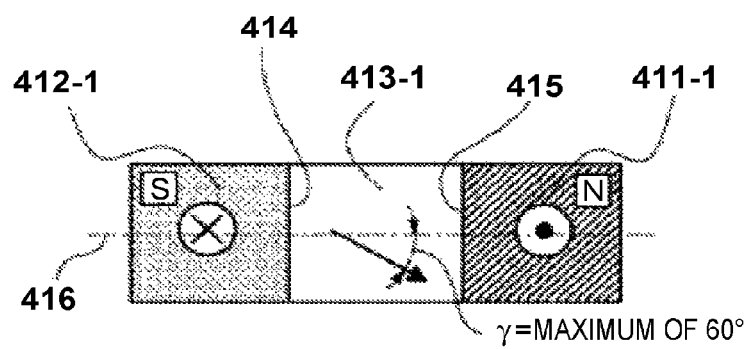

A first magnet element 40 will be explained with reference to FIGS. 4A and 4B to which the present invention is applicable. FIG. 4A is a sectional view showing the first magnet element 40. FIG. 4B is a plan view showing the first magnet element 40. As shown in FIG. 4A, the first magnet element 40 has an arrangement in which a first magnet 411-1 and a second magnet 412-1 are fixed on the two end portions of a magnetic plate (yoke plate) 410 by an adhesive, and a third magnet 413-1 is fixed between the first magnet 411-1 and the second magnet 412-1 by the adhesive. In this example, an epoxy adhesive is used.

The magnetic poles of the first magnet element 40 will be described. As shown in FIG. 4A, the first magnet 411-1 and the second magnet 412-1 have magnetic poles parallel to the direction of the normal to the surface of the magnetic plate 410, and the magnetic poles of the first magnet 411-1 are oriented in a direction opposite to that of the magnetic poles of the second magnet 412-1. More specifically, in this embodiment, the first magnet 411-1 is arranged to stand upright on the plate surface of the yoke plate (magnetic plate) 410 along the vertical direction. The first magnet 411-1 has the first magnetic pole (S pole) on a surface facing the plate surface of the yoke plate (magnetic plate) 410, and the second magnetic pole (N pole) unlike the first magnetic pole (S pole) on a surface (the target side) facing away from the plate surface of the yoke plate (magnetic plate) 410. The second magnet 412-1 is provided to stand upright on the plate surface of the yoke plate (magnetic plate) 410 along the vertical direction. The second magnet 412-1 has the third magnetic pole (N pole) unlike the first magnetic pole (S pole) on the surface facing the plate surface of the yoke plate (magnetic plate) 410, and the fourth magnetic pole (S pole) unlike the second magnetic pole (N pole) on the surface (the target side) facing away from the plate surface of the yoke plate (magnetic plate) 410.

Consequently, on the surface facing the target 6, the second magnetic pole (N pole) appears in the first magnet 411-1 and the fourth magnetic pole (S pole) appears in the second magnet 412-1. The third magnet 413-1 is arranged to stand upright between the first magnet 411-1 and the second magnet 412-1. The third magnet 413-1 has the fifth magnetic pole (N pole) in a portion facing the second magnetic pole (N pole) of the first magnet 411-1, and the sixth magnetic pole (S pole) unlike the fifth magnetic pole (N pole) in a portion facing the third magnetic pole (N pole) of the second magnet 412-1. The third magnet 413-1 is magnetized so that a line which connects the fifth magnetic pole (N pole) and the sixth magnetic pole (S pole) is tilted with respect to the flat plate surface of the yoke plate (magnetic plate) 410. That is, the line which connects the fifth magnetic pole (N pole) and the sixth magnetic pole (S pole) of the third magnet 413-1 forms an angle θ in a direction from the third magnetic pole (N pole) of the second magnet 412-1 to the second magnetic pole (N pole) of the first magnet 411-1, that is, a direction from a direction parallel to the surface of the magnetic plate 410 to the target 6. The third magnet 413-1 has magnetic poles forming an angle γ in the clockwise direction with respect to a line which connects the fourth magnetic pole (S pole) of the second magnet 412-1 and the second magnetic pole (N pole) of the first magnet 411-1, that is, an imaginary line 416, a perpendicular dropped to a side 414 or 415 shown in FIG. 4B.

In other words, the line which connects the fifth magnetic pole (N pole) and sixth magnetic pole (S pole) of the third magnet 413-1 forms an angle of 60° or smaller in the clockwise direction with respect to the line which connects the second magnetic pole (N pole) of the first magnet 411-1 and the fourth magnetic pole (S pole) of the second magnet 412-1 along the flat plate surface of the yoke plate (magnetic plate) 410. The polarity of the fifth magnetic pole (N pole) of the third magnet 413-1, therefore, repels that of the second magnetic pole (N pole) of the first magnet 411-1.

Figure 5A:
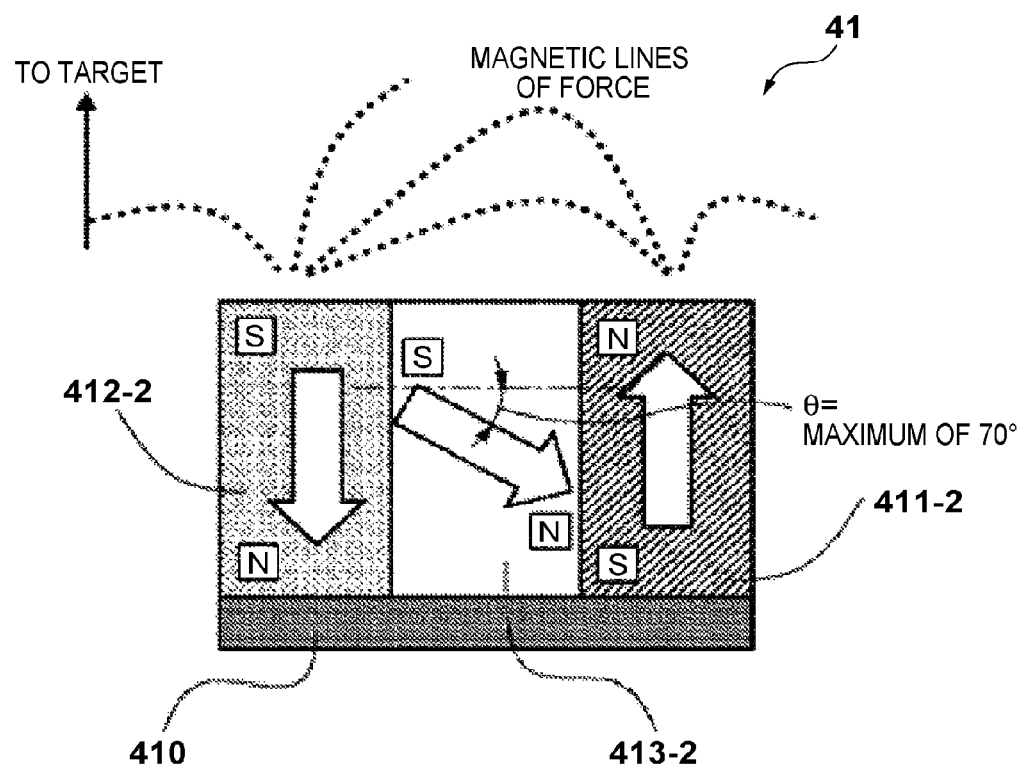
FIGS. 5A and 5B are schematic views showing a second magnet element according to the present invention.
Figure 5B:
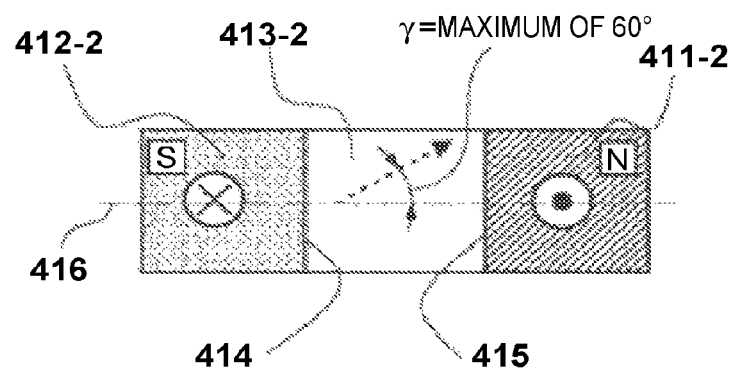

The magnetic poles of the second magnet element 41 will be described with reference to FIGS. 5A and 5B. FIG. 5A is a sectional view showing the second magnet element 41. FIG. 5B is a plan view showing the second magnet element 41. As shown in FIG. 5A, the second magnet element 41 has an arrangement in which a fourth magnet 411-2 and a fifth magnet 412-2 are fixed on the two end portions of the magnetic plate (yoke plate) 410 by an adhesive, and a sixth magnet 413-2 is fixed between the fourth magnet 411-2 and the fifth magnet 412-2 by the adhesive. In this example, an epoxy adhesive is used.

The magnetic poles of the second magnet element 41 will be explained next. As shown in FIG. 5A, the fourth magnet 411-2 and the fifth magnet 412-2 have magnetic poles parallel to the direction of the normal to the surface of the magnetic plate 410, and the magnetic poles of the fourth magnet 411-2 are oriented in a direction opposite to that of the magnetic poles of the fifth magnet 412-2. More specifically, in this embodiment, the fourth magnet 411-2 is provided to stand upright on the plate surface of the yoke plate (magnetic plate) 410 along the vertical direction. The fourth magnet 411-2 has the seventh magnetic pole (S pole) on a surface facing the plate surface of the yoke plate (magnetic plate) 410, and the eighth magnetic pole (N pole) unlike the seventh magnetic pole (S pole) on a surface (the target side) facing away from the plate surface of the yoke plate (magnetic plate) 410. The fifth magnet 412-2 is provided to stand upright on the plate surface of the yoke plate (magnetic plate) 410 along the vertical direction. The fifth magnet 412-2 has the ninth magnetic pole (N pole) unlike the seventh magnetic pole (S pole) on the surface facing the plate surface of the yoke plate (magnetic plate) 410, and the 10th magnetic pole (S pole) unlike the eighth magnetic pole (N pole) on the surface (the target side) facing away from the plate surface of the yoke plate (magnetic plate) 410. Consequently, on the surface facing the target, the eighth magnetic pole (N pole) appears in the fourth magnet 411-2 and the 10th magnetic pole (S pole) appears in the fifth magnet 412-2.

The sixth magnet 413-2 is arranged to stand upright between the fourth magnet 411-2 and the fifth magnet 412-2. The sixth magnet 413-2 has the 11th magnetic pole (N pole) in a portion facing the seventh magnetic pole (S pole) of the fourth magnet 411-2, and the 12th magnetic pole (S pole) unlike the 11th magnetic pole (N pole) in a portion facing the 10th magnetic pole (N pole) of the fifth magnet 412-2. The sixth magnet 413-2 is magnetized so that a line which connects the 10th magnetic pole (S pole) and the 11th magnetic pole (N pole) is tilted with respect to the flat plate surface of the yoke plate (magnetic plate) 410. Consequently, the line which connects the 10th magnetic pole (S pole) and the 11th magnetic pole (N pole) of the sixth magnet 413-2 forms the angle θ in a direction from the 10th magnetic pole (S pole) of the fifth magnet 412-2 to the seventh magnetic pole (S pole) of the fourth magnet 411-2, that is, a direction from a direction parallel to the surface of the magnetic plate 410 to the rear surface of the yoke plate 410. The sixth magnet 413-2 has magnetic poles forming the angle γ in the counterclockwise direction with respect to a line which connects the 10th magnetic pole (S pole) of the fifth magnet 412-2 and the eighth magnetic pole (N pole) of the fourth magnet 411-2, that is, the imaginary line 416, a perpendicular dropped to the side 414 or 415 shown in FIG. 5B. In other words, the line which connects the 11th magnetic pole (S pole) and 12th magnetic pole (N pole) of the sixth magnet 413-2 forms an angle of 60° or smaller in the counterclockwise direction with respect to the line which connects the eighth magnetic pole (N pole) of the fourth magnet 411-2 and the 10th magnetic pole (S pole) of the fifth magnet 412-2 along the flat plate surface of the yoke plate (magnetic plate) 410. The polarity of the 12th magnetic pole (S pole) of the sixth magnet 413-2, therefore, repels that of the 10th magnetic pole (S pole) of the fifth magnet 412-2.

The shape of the magnetic lines of force formed by the first magnet element 40 will be explained with reference to FIGS. 4A and 4B. As described above, on the surface facing the target 6, the S pole appears in the second magnet 412-1 of the first magnet element 40, and the N pole appears in the first magnet 411-1 of the first magnet element 40. Of the magnetic poles of the third magnet 413-1, the first component parallel to the normal to the surface of the magnetic plate 410 is oriented from the N pole of the second magnet 412-1 to the N pole of the first magnet 411-1. On the other hand, of the poles of the third magnet 413-1, the second component perpendicular to the normal to the surface of the magnetic plate 410 is oriented from the S pole of the second magnet 412-1 to the N pole of the first magnet 411-1. In the first magnet element 40 in this example, the number of magnetic lines of force (a magnetic flux density) exiting the N pole of the first magnet which faces the surface of the target 6 increases. A region in which, of the magnetic lines of force which are oriented from the N pole of the first magnet 411-1 to the S pole of the second magnet 412-1, components parallel to the direction of the normal to the surface of the target 6 are zero shifts to the second magnet 412-1 side.

The shape of the magnetic lines of force formed by the second magnet element 41 will be explained with reference to FIGS. 5A and 5B. Similarly to the first magnet 411-1 and the second magnet 412-1 of the first magnet element, on the surface facing the target, the S pole appears in the fifth magnet 412-2 of the second magnet element 41, and the N pole appears in the fourth magnet 411-2 of the second magnet element 41. Of the magnetic poles of the sixth magnet 413-2, the first component parallel to the normal to the surface of the magnetic plate 410 is oriented from the S pole of the fifth magnet 412-2 to the S pole of the fourth magnet 411-2. On the other hand, of the poles of the sixth magnet 413-2, the second component perpendicular to the normal to surface of the magnetic plate 410 is oriented from the S pole of the fifth magnet 412-2 to the N pole of the fourth magnet 411-2. In the second magnet element 41 in this example, the number of magnetic lines of force entering the S pole of the fifth magnet 412-2 which faces the surface of the target 6 increases. A region in which, of the magnetic lines of force which are oriented from the N pole of the fourth magnet 411-2 to the S pole of the fifth magnet 412-2, components parallel to the direction of the normal to the surface of the target 6 are zero shifts to the fourth magnet 411-2 side.

Figure 6A:
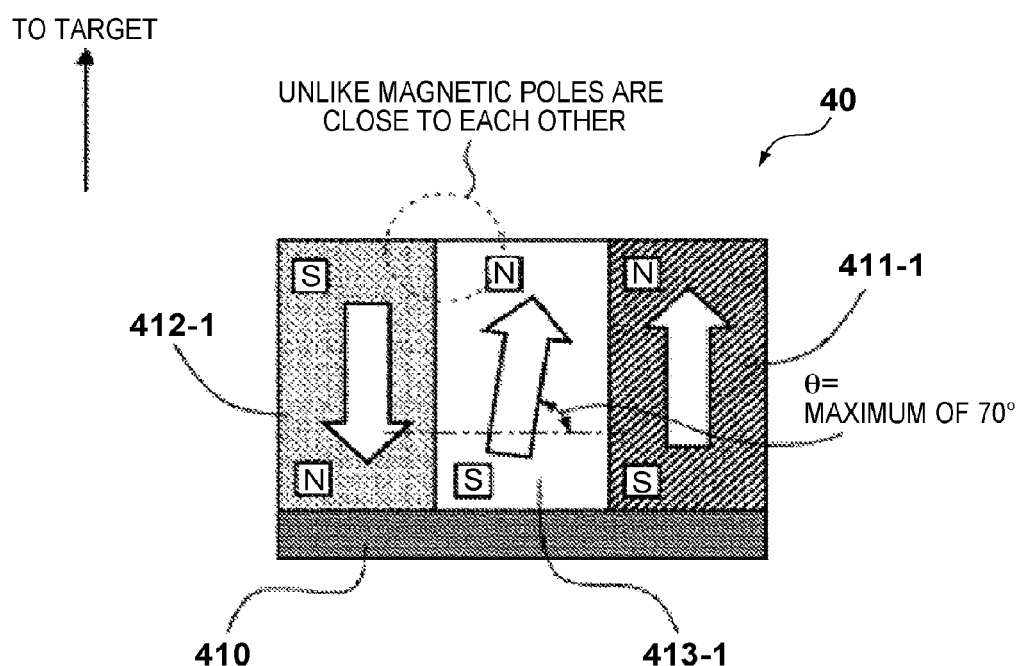
FIGS. 6A and 6B are schematic views showing a case in which unlike magnetic poles are close to each other in the first magnet element according to the present invention.
Figure 6B:
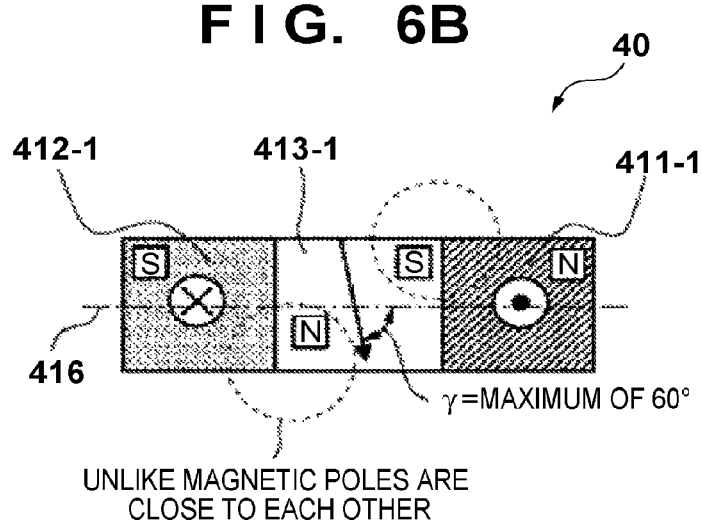

Note that the directions and values of θ and γ shown in FIGS. 4A, 4B, 5A, and 5B are merely examples, and "−70°≤θ<10° or 10°<θ≤70°" and "−60°≤γ≤60°" are desirable. This will be described with reference to FIGS. 6A and 6B. If the absolute value of θ exceeds 70°, the polarity of the fifth magnetic pole (N pole) of the third magnet 413-1 has a direction almost perpendicular to the surface of the magnetic plate 410 (FIG. 6A). Therefore, unlike magnetic poles (in FIG. 6A, the S pole of the second magnet 412-1 and the N pole of the third magnet 431-1) come close to each other, and the magnetic lines of force close directly above the magnets 412-1 and 413-1, thereby decreasing the number of magnetic lines of force on the target. Similarly, if the absolute value of γ exceeds 60°, the sixth magnetic pole (S pole) of the third magnet 413-1 comes close to the second magnetic pole (N pole) of the first magnet 411-1 and the fifth magnetic pole (N pole) of the third magnet 413-1 comes close to the fourth magnetic pole (S pole) of the second magnet 412-1 (FIG. 6B). Therefore, the magnetic lines of force close directly above the magnets 411-1, 412-2, and 413-1, thereby decreasing the number of magnetic lines of force on the target. If the value (absolute value) of θ is equal to or smaller than 10°, a region in which components, parallel to the direction of the normal to the surface of the target, of the magnetic lines of force on the surface of the magnet element are zero has a small shift amount. FIGS. 6A and 6B show the first magnet element 40 in this case. The same goes for the second magnet element 41 with respect to the directions and values of θ and γ.

The definition of a minus sign (−) for an angle will be described. −θ indicates an angle formed when a component, parallel to the normal to the surface of the magnetic plate 410, of the magnetic poles of the third magnet 413-1 or the sixth magnet 413-2 is oriented in the same direction as that of the magnetic poles of the second magnet 412-1 or the fifth magnet 412-2. −γ indicates an angle, with respect to the imaginary line 416, formed by the direction of the N pole of the third magnet 413-1 which has rotated in the clockwise direction. That is, in the first magnet element 40 shown in FIGS. 4A and 4B, since the N and S poles of the third magnet 413-1 are oriented in a direction opposite to that of the N and S poles of the second magnet 412-1, θ is positive. Since the direction of the N pole of the third magnet 413-1 has rotated in the clockwise direction with respect to the imaginary line 416, γ is negative. On the other hand, in the second magnet element 41 shown in FIGS. 5A and 5B, θ is negative and γ is positive.

Figure 7A:
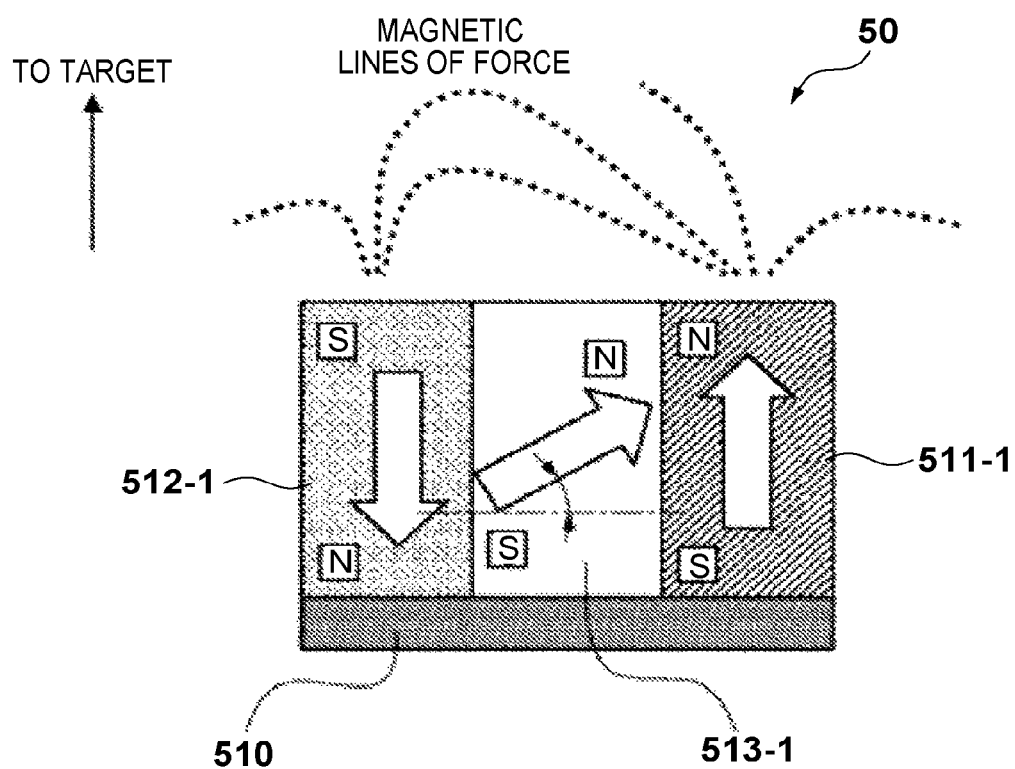
FIGS. 7A and 7B are schematic views showing a third magnet element according to the present invention.
Figure 7B:
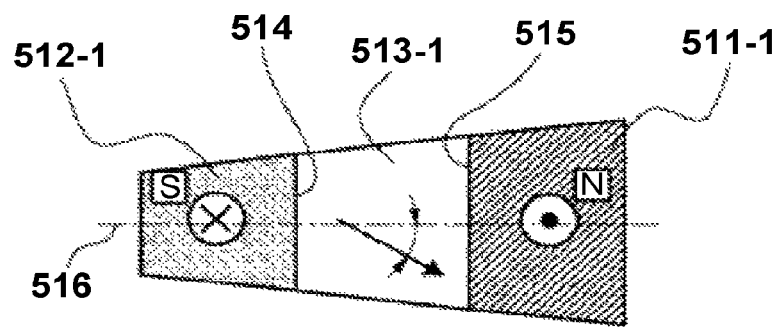
Figure 8A:
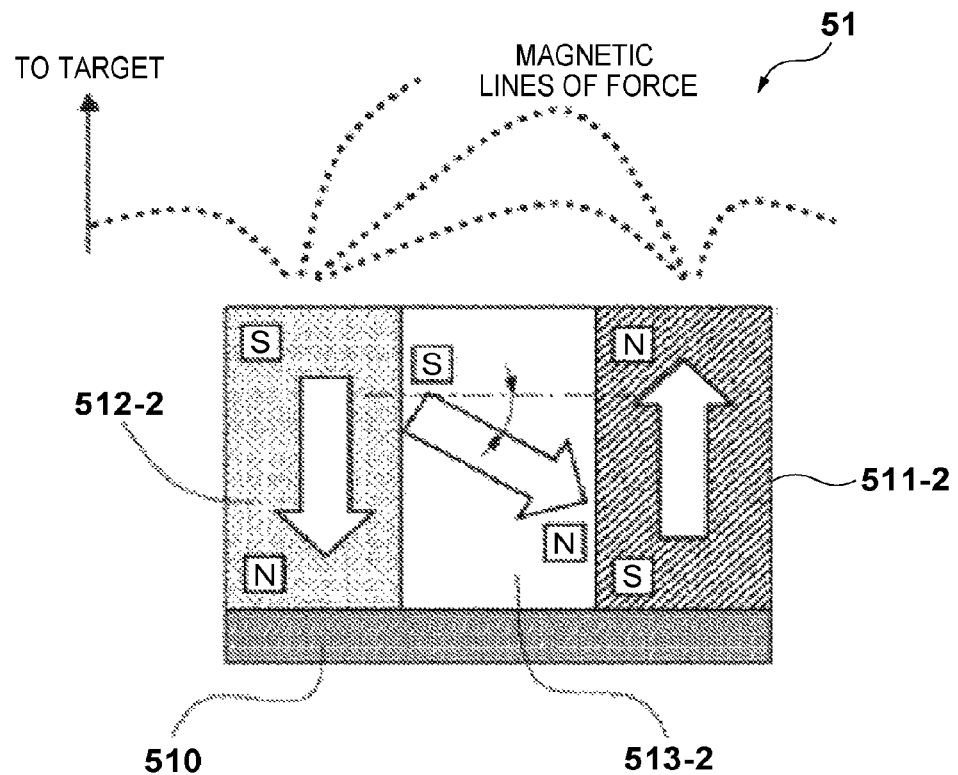
FIGS. 8A and 8B are schematic views showing a fourth magnet element according to the present invention.
Figure 8B:
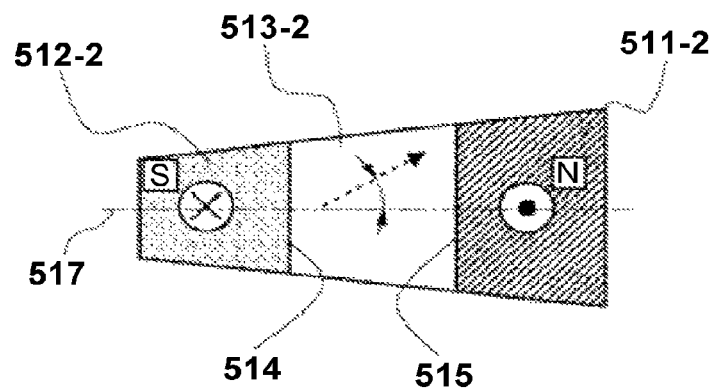

According to the above-described method, it is apparent that the present invention is readily applicable to a trapezoidal third magnet element 50 shown in FIGS. 7A and 7B or a trapezoidal fourth magnet element 51 shown in FIGS. 8A and 8B. Note that, in the third magnet element 50 shown in FIGS. 7A and 7B, the volume of an eighth magnet 512-1 corresponding to the second magnet 412-1 of the first magnet element 40 shown in FIGS. 4A and 4B is smaller than that of a seventh magnet 511-1 corresponding to the first magnet 411-1 of the first magnet element 40 shown in FIGS. 4A and 4B. Except for this, the third magnet element 50 has the same arrangement as that of the first magnet element 40 shown in FIGS. 4A and 4B. Note that a ninth magnet 513-1 shown in FIGS. 7A and 7B corresponds to the third magnet 413-1 of the first magnet element 40 shown in FIGS. 4A and 4B. A 10th magnet 511-2, an 11th magnet 512-2, and a 12th magnet 513-2 shown in FIGS. 8A and 8B correspond to the fourth magnet 411-2, the fifth magnet 412-2, and the sixth magnet 413-2 of the second magnet element 41 shown in FIGS. 5A and 5B, respectively. FIG. 7A is a sectional view showing the third magnet element 50. FIG. 7B is a plan view showing the third magnet element 50. Furthermore, in the fourth magnet element 51 shown in FIGS. 8A and 8B, the volume of the 11th magnet 512-2 corresponding to the fifth magnet 412-2 of the second magnet element 41 shown in FIGS. 5A and 5B is smaller than that of the 10th magnet 511-2 corresponding to the fourth magnet 411-2 of the second magnet element 41 shown in FIGS. 5A and 5B. Except for this, the fourth magnet element 51 has the same arrangement as that of the second magnet element 41 shown in FIGS. 5A and 5B. FIG. 8A is a sectional view showing the fourth magnet element 51. FIG. 8B is a plan view showing the fourth magnet element 51.

A region in which components, parallel to the direction of the normal to the surface of a target, of magnetic lines of force appearing on the surface of the target are zero in FIGS. 7A and 7B or FIGS. 8A and 8B is different from that of the first magnet element 40 shown in FIGS. 4A and 4B or the second magnet element 41 shown in FIGS. 5A and 5B. The shape shown in FIGS. 7A and 7B or FIGS. 8A and 8B is preferable to an example shown in FIG. 14. In this example, the shape becomes narrower on the S pole side (the magnet 512-1 or 512-2). A gap between neighboring magnet elements is eliminated or decreased by arranging such magnet elements in an arc with its center on the S pole side, thereby enabling to suppress a decrease in number of magnetic lines of force near the N pole side (the magnet 511-1 or 511-2).

Figure 9:
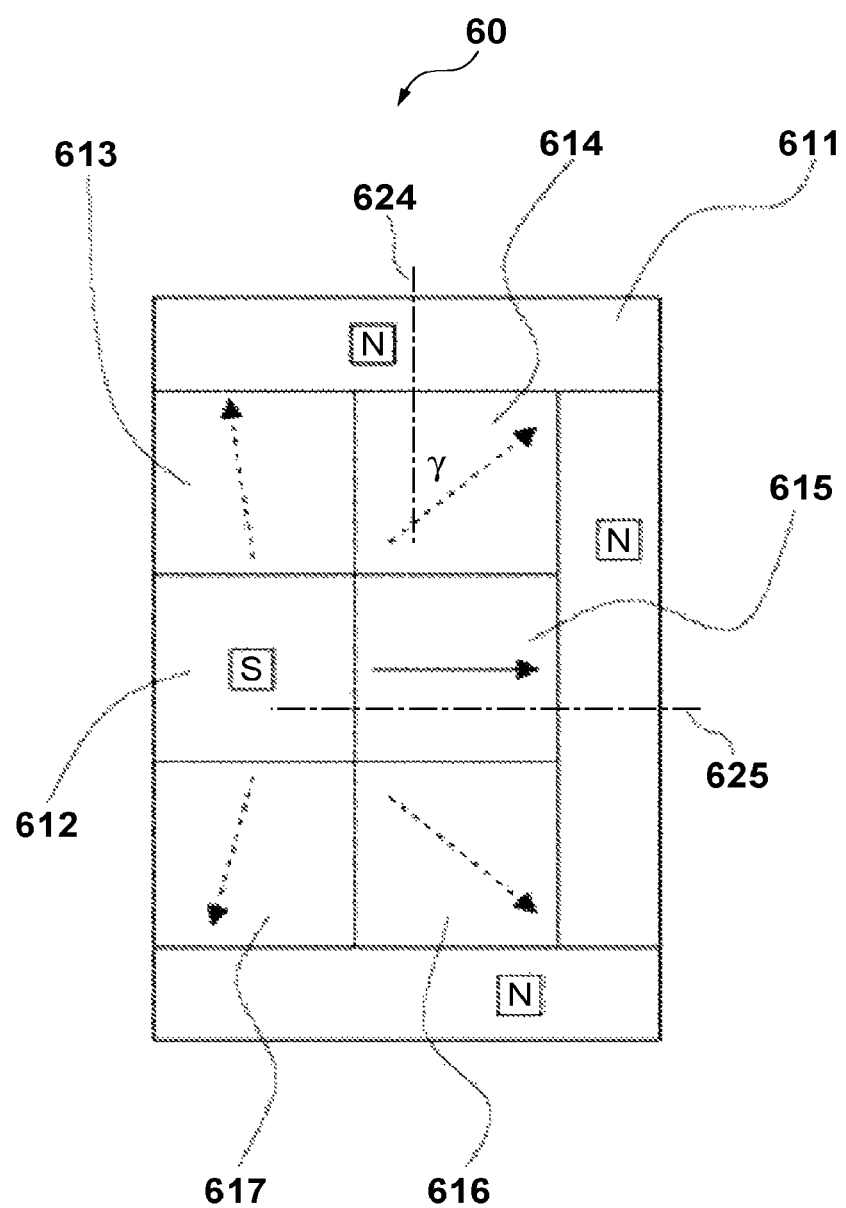
FIG. 9 is a plan view showing a fifth magnet element according to the present invention.

A fifth magnet element 60 shown in FIGS. 9 and 10 is also an example to which the present invention is applicable. FIG. 9 is a plan view showing the fifth magnet element. In the fifth magnet element 60, 13th to 19th magnets 611 to 617 are fixed on a magnetic plate 610. The U-shaped 13th magnet 611 is provided on the rectangular magnetic plate 610. The 13th magnet 611 has magnetic poles parallel to the direction of the normal to the surface of the magnetic plate 610, and has the N pole on the side facing a target and the S pole on the side facing the magnetic plate 610. The 14th magnet 612 is provided within the U-shaped 13th magnet 611. The 14th magnet 612 has the magnetic poles parallel to the direction of the normal to the surface of the magnetic plate 610 similarly to the 13th magnet 611, but the magnetic poles have a direction opposite to that of the magnetic poles of the 13th magnet 611. The 15th magnet 613, 16th magnet 614, 17th magnet 615, 18th magnet 616, and 19th magnet 617 are inserted between the 14th magnet 612 and the 13th magnet 611 to form a U-shape. The angle γ of the magnetic poles is as follows.

The angle γ of the magnetic poles of the 17th magnet 615 is 0° with respect to an imaginary line 625, a perpendicular dropped to an interface between the 14th magnet 612 and the 17th magnet 615. The 17th magnet 615 forms the angle θ in a direction from the N pole of the 14th magnet 612 to the N pole of the 13th magnet 611, that is, a direction from a direction parallel to the surface of the magnetic plate 610 to the target 6. The angle γ of the magnetic poles of the 16th magnet 614 is negative with respect to an imaginary line 624, a perpendicular dropped to the imaginary line 625. The definition of the minus sign (−) of the angle is the same as that for the first to fourth magnet elements. Assume that −γ indicates an angle, with respect to the imaginary line 624, formed by the direction of the N pole of each of the 15th to 19th magnets 613 to 617 which has rotated in the clockwise direction. Since the N pole of the 16th magnet 614 has rotated in the clockwise direction with respect to the imaginary line 624, therefore, γ is negative. To the contrary, the N pole of the 15th magnet 613 has rotated in the counterclockwise direction with respect to the imaginary line 624, γ is positive. The 18th magnet 616 and the 19th magnet 617 have magnetic poles symmetrical to those of the 16th magnet 614 and the 15th magnet 613 with respect to the imaginary line 625, respectively.

FIG. 10 is a perspective view for easy understanding of the magnetic pole direction of each magnet of the fifth magnet element 60. With the shape of the fifth magnet element 60, it is possible to form a meandering erosion track even in the two end portions of a rectangular cathode magnet (to be described later), and to prevent a concentrated erosion portion from occurring on the target by swinging the cathode magnet.

FIGS. 11A to 11C show the first magnet unit 70 to present part of an arrangement obtained by alternately arranging the first magnet element 40 described with reference to FIGS. 4A and 4B and the second magnet element 41 described with reference to FIGS. 5A and 5B so that like magnetic poles are adjacent to each other. FIG. 11A is a plan view showing the first magnet unit 70. FIG. 11B is a plan view showing the first magnet element 40. FIG. 11C is a plan view showing the second magnet element 41. In this example, the first magnet element 40 and the second magnet element 41 are spaced apart from each other. The distance (separation) between them is preferably 30 mm or shorter. With this arrangement, a group of points at which components, parallel to the normal to the surface of a target (not shown), of a magnetic field appearing on the target are zero, that is, a magnetic track 710 forms a wavy shape. If the distance is 30 mm or longer, the magnetic track 710 does not form a wavy shape.

Figure 12:
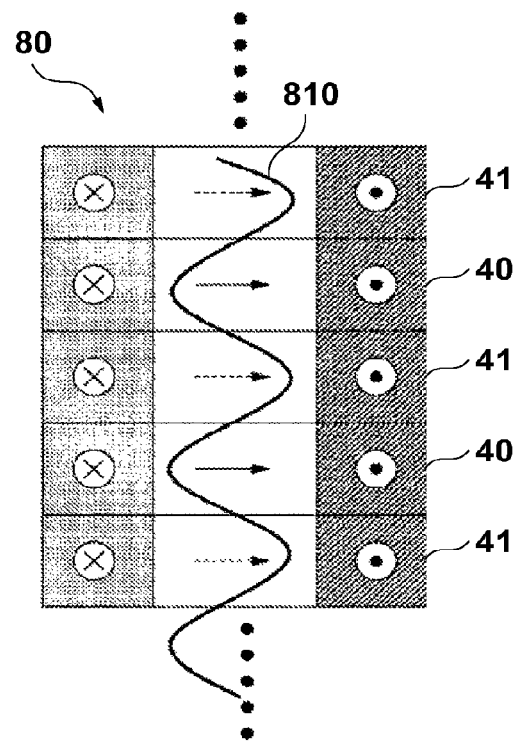
FIG. 12 is a schematic view showing a second magnet unit according to the present invention.

FIG. 12 shows the second magnet unit 80 to present part of an arrangement obtained by alternately arranging the first magnet element 40 described with reference to FIGS. 4A and 4B and the second magnet element 41 described with reference to FIGS. 5A and 5B so that like magnetic poles are in tight contact with each other. With this arrangement, a group of points at which components, parallel to the normal to the surface of a target (not shown), of a magnetic field appearing on the target are zero, that is, a magnetic track 810 forms a wavy shape.

A difference between the arrangements in FIGS. 11A and 12 is the distance between the first magnet element 40 and the second magnet element 41 which are linearly arranged. By giving a gap (interval) as shown in FIG. 11A, a magnetic field component parallel to the surface of the target (not shown) in the magnetic track appearing on the surface of the target becomes small. To the contrary, it is possible to increase a magnetic field component on the target by densely arranging the magnet elements, as shown in FIG. 12.

Figure 13:
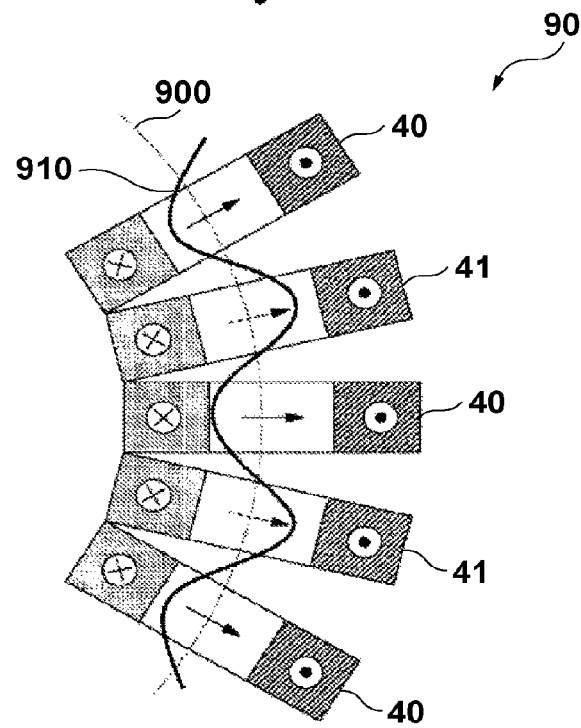
FIG. 13 is a schematic view showing a third magnet unit according to the present invention.

Referring to FIG. 13, the first magnet element 40 and the second magnet element 41 are alternately arranged along an arcuate imaginary line (circle) 900, and a wavy magnetic track 910 appears almost along the imaginary line (circle) 900. A magnet unit including outer peripheral magnets and inner magnets which are arranged inside the outer peripheral magnets and have polarities different from those of the outer peripheral magnets is formed on the plate surface of a yoke plate.

Figure 14:
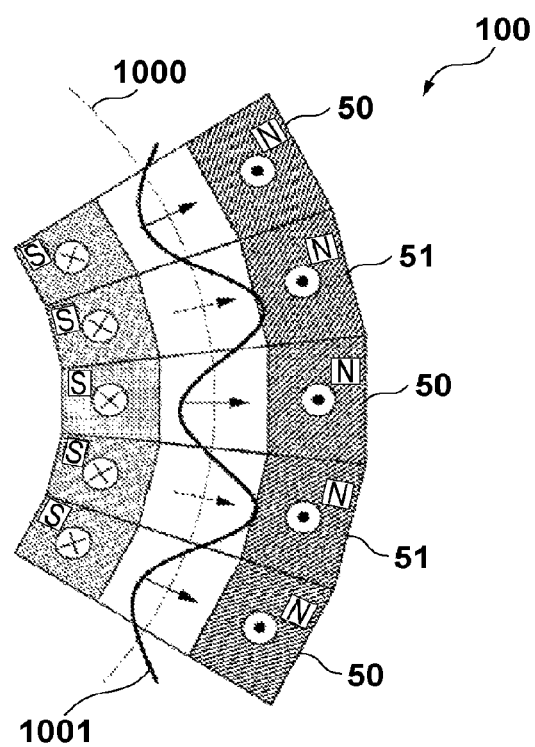
FIG. 14 is a schematic view showing a fourth magnet unit according to the present invention.

FIG. 14 is a view showing a case in which a wavy magnetic track 1001 occurs along an arcuate imaginary line 1000 by alternately arranging the third magnet element 50 and the fourth magnet element 51 so that like magnetic poles are in contact with each other. Note that when the value (absolute value) of θ becomes 10° or smaller, the shift amount of a region where components, parallel to the direction of the normal to the surface of a target, of magnetic lines of force on the surface of a magnet element are zero becomes small, and therefore, the magnetic track does not form a wavy shape. The same goes for the examples shown in FIGS. 11A to 11C, 12, and 13.

Example 1

In Example 1, the shape of a magnetic track is examined using a circular cathode electrode 203 arranged in a sputtering apparatus 200 (FIG. 15) to which the present invention is applicable. A magnet unit 201 is as shown in FIG. 16. A magnet used in the fifth magnet unit 201 is made of NdFeB, which has a maximum energy product of 381 KJ/m$^3$ (48 MGOe). The diameter of the fifth magnet unit 201 is 370 mm, and the height of a magnet portion is 30 mm. In the fifth magnet unit 201, 24 magnet elements are fixed along an inverted-heart shape. The 24 magnet elements include the first magnet element 40 shown in FIGS. 4A and 4B, the second magnet element 41 shown in FIGS. 5A and 5B, the third magnet element 50 shown in FIGS. 7A and 7B, and the fourth magnet element 51 shown in FIGS. 8A and 8B, and the first to fourth magnet elements are provided along the inverted-heart shape shown in FIG. 16 according to the polarities and positions shown in table 1 below.

Note that SS400 with a thickness of 12 mm was used as a magnetic plate serving as a yoke plate. Table 1 below shows a positional relationship and the magnetic pole direction of each magnet element of the fifth magnet unit 201. Note that it is also possible to form the fifth magnet unit 201 by fixing the 24 magnet elements in, for example, a circle or ellipse. That is, it is possible to fix the 24 magnet elements in any shape as long as the shape is endless.

TABLE 1

| No. | θ° | γ° |
|---|---|---|
| 1 | −45 | 0 |
| 2 | 45 | 0 |
| 3 | −45 | 0 |
| 4 | 45 | 0 |
| 5 | −45 | 0 |
| 6 | 45 | 0 |
| 7 | −45 | 0 |
| 8 | 45 | 0 |
| 9 | −45 | 0 |
| 10 | 45 | 0 |
| 11 | −45 | 0 |
| 12 | 45 | 0 |
| 13 | −45 | 0 |
| 14 | 45 | 0 |
| 15 | −45 | 0 |
| 16 | 45 | 0 |
| 17 | −45 | 0 |
| 18 | 45 | 0 |
| 19 | −45 | 0 |
| 20 | 45 | 0 |
| 21 | −45 | 0 |
| 22 | 45 | 0 |
| 23 | −45 | 0 |
| 24 | 45 | 0 |

Nos. 1 to 24 in table 1 represent numbers given in the fifth magnet unit 201 shown in FIG. 16. The first magnet elements 40 are arranged at positions indicated by Nos. 2, 4, 6, 8, 10, and 18 in table 1. The second magnet elements 41 are arranged at positions indicated by Nos. 1, 3, 5, 7, 9, 11, 17, and 19 in table 1. The third magnet elements 50 are arranged at positions indicated by Nos. 12, 14, 16, 20, 22, and 24 in table 1. The fourth magnet elements 51 are arranged at positions indicated by Nos. 13, 15, 21, and 23 in table 1.

A target 202 shown in FIG. 17A is fixed on the front of the fifth magnet unit 201 via a rear plate (not shown). In this case, the distance between the surface of the target 202 and that of the fifth magnet unit 201 is 14 mm. The target 202 is made of an FeCo alloy, which has a thickness of 3 mm and a diameter of 376 mm.

To examine a magnetic track on the target 202, the circular cathode electrode 203 was arranged in a magnetic field measurement device (not shown). A probe connected with the magnetic field measurement device was positioned at a height of 1.0 mm directly above the target, and scanned in the plane direction of the target 202 while keeping its height. In this case, scanning directions were the x and y directions in FIG. 16 and the value of a magnetic flux density was acquired in the x, y, and z directions. Note that a computer (not shown) controlled the scan operation and magnetic flux density value acquisition of the probe.

As a result of extracting a region where components (composite components in the x and y directions=$(x2+y2)$ ½) of the obtained magnetic flux density, which were parallel to the surface of the target and had a value of 50 mT or larger, and points at which components, parallel to the normal to the surface of the target, of the obtained magnetic flux density were zero, that is, a magnetic track, it was found that a magnetic track 210 had a wavy shape as shown in FIG. 17A. Note that if components, parallel to the surface of the target, of the magnetic flux density on the magnetic track have a value of 50 mT or larger (a region 211), a stable electric discharge is possible. It is found from this result that it is possible to obtain a magnetic field strength with which a stable electric discharge is possible while obtaining the wavy magnetic track 210.

Figure 15:
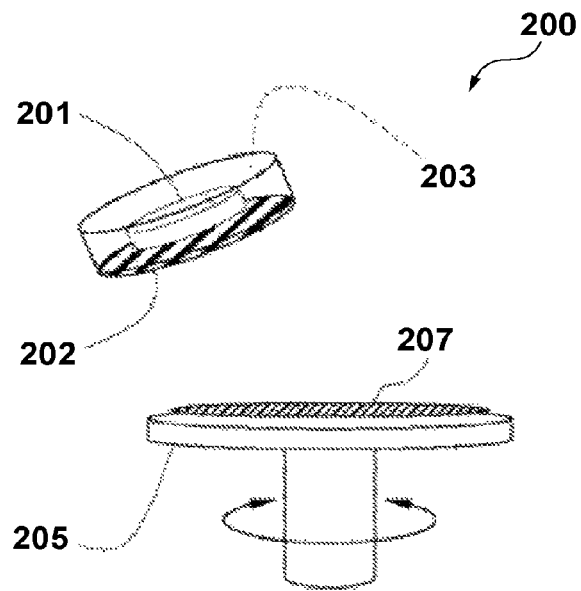
FIG. 15 is a schematic view showing a sputtering apparatus to which the present invention is applicable.

The fifth magnet unit 201 was attached to the circular cathode electrode 203 shown in FIG. 15, and was caused to discharge while being rotated parallel to the surface of the target 202, thereby performing sputtering deposition. When examining an erosion distribution on the target 202 after using 60 kWh, a result shown in FIG. 17B was obtained. The deepest portion of an erosion portion presents a "gentle valley" shape, thereby preventing a concentration of erosion.

Comparative Example 1

To ensure that the present invention is effective, a case in which a conventional magnet element is used will be described as Comparative Example 1. Assume that a magnet unit (to be referred to as "Comparative Example 1 magnet unit" hereinafter) according to Comparative Example 1 has the same arrangement as that of a fifth magnet unit 201. A magnet used in the Comparative Example 1 magnet unit is made of NdFeB which has a maximum energy product of 381 KJ/m$^3$ (48 MGOe). SS400 with a thickness of 12 mm is used as a magnetic plate serving as a yoke plate. The Comparative Example 1 magnet unit has an outermost diameter of 370 mm and a magnet portion has a height of 30 mm. The Comparative Example 1 magnet unit is formed by fixing 24 magnet elements along an inverted-heart shape. Each of the 24 magnet elements has the shape of a first magnet element 40 shown in FIGS. 4A and 4B, a second magnet element 41 shown in FIGS. 5A and 5B, a third magnet element 50 shown in FIGS. 7A and 7B, or a fourth magnet element 51 shown in FIGS. 8A and 8B. The above-described conditions are the same as those for the fifth magnet unit 201. Note that, as shown in table 2 below, a point different from the magnet unit 201 is that θ and γ are all 0°. Table 2 below shows a positional relationship and a magnetic pole direction of each magnet element of the Comparative Example 1 magnet unit.

TABLE 2

| No. | θ° | γ° |
|---|---|---|
| 1 | 0 | 0 |
| 2 | 0 | 0 |
| 3 | 0 | 0 |
| 4 | 0 | 0 |

TABLE 2-continued

| No. | θ° | γ° |
|-----|----|----|
| 5   | 0  | 0  |
| 6   | 0  | 0  |
| 7   | 0  | 0  |
| 8   | 0  | 0  |
| 9   | 0  | 0  |
| 10  | 0  | 0  |
| 11  | 0  | 0  |
| 12  | 0  | 0  |
| 13  | 0  | 0  |
| 14  | 0  | 0  |
| 15  | 0  | 0  |
| 16  | 0  | 0  |
| 17  | 0  | 0  |
| 18  | 0  | 0  |
| 19  | 0  | 0  |
| 20  | 0  | 0  |
| 21  | 0  | 0  |
| 22  | 0  | 0  |
| 23  | 0  | 0  |
| 24  | 0  | 0  |

Nos. 1 to 24 in table 2 represent numbers given in the fifth magnet unit 201 shown in FIG. 16. The first magnet elements 40 are arranged at positions indicated by Nos. 2, 4, 6, 8, 10, and 18 in table 2. The second magnet elements 41 are arranged at positions indicated by Nos. 1, 3, 5, 7, 9, 11, 17, and 19 in table 2. The third magnet elements 50 are arranged at positions indicated by Nos. 12, 14, 16, 20, 22, and 24 in table 2. The fourth magnet elements 51 are arranged at positions indicated by Nos. 13, 15, 21, and 23 in table 2.

A target 202 shown in FIG. 18A is fixed on the front of the Comparative Example 1 magnet unit via a rear plate (not shown). In this case, the distance between the surface of the target 202 and that of the Comparative Example 1 magnet unit is 14 mm. The target 202 is made of an FeCo alloy, which has a thickness of 3 mm and a diameter of 376 mm.

To examine a magnetic track on the target 202, a circular cathode electrode 203 shown in FIG. 15 was arranged in a magnetic field measurement device (not shown). A probe connected with the magnetic field measurement device was positioned at a height of 1.0 mm directly above the target, and scanned in the plane direction of the target 202 while keeping its height. In this case, scanning directions were the x and y directions in FIG. 16, and the value of a magnetic flux density was acquired in the x, y, and z directions. Note that a computer (not shown) controlled the scan operation and magnetic flux density value acquisition of the probe.

A result shown in FIG. 18A was obtained by extracting a region 251 in which components (composite components in the x and y directions=$(x2+y2)^{1/2}$) of the obtained magnetic flux density, which were parallel to the surface of the target and had a value of 50 mT or larger, and points at which components, parallel to the normal to the surface of the target, of the obtained magnetic flux density were zero, that is, a magnetic track 252. The magnetic track never has a wave shape in Comparative Example 1, as a matter of course.

The Comparative Example 1 magnet unit was attached to the circular cathode electrode 203 shown in FIG. 15, and was caused to discharge while being rotated parallel to the surface of the target 202, thereby performing sputtering deposition. When examining an erosion distribution on the target 202 after using 40 kWh, a result shown in FIG. 18B was obtained. The deepest portion of an erosion portion presents a "sharp valley" shape and it is thus found that the use efficiency of the target decreased due to the concentration of erosion. The effects of the present invention become apparent by comparing FIG. 17B with FIG. 18B.

Example 2

In Example 2, dimensions were the same as those in Example 1, the materials of a magnet and target were changed, and then the shape of a magnetic track appearing on the surface of a target was examined. A method of using a magnetic field measurement device is the same as that in Example 1. A magnet used in a fifth magnet unit 201 is made of an SmSo-based material which has a maximum energy product of 151 KJ/m$^3$ (19 MGOe). The target is made of Ta (a non-magnetic material). This combination causes the magnetic track to have a wavy shape, and it was found that components, parallel to the surface of the target, of a magnetic flux density on the magnetic track had a value of 50 mT or larger.

That is, by applying the present invention, it becomes possible to obtain a magnetic flux density with which a discharge is possible while obtaining a wavy magnetic track regardless of a magnet material.

Example 3

In Example 3, the shape of a magnetic track was examined using a rectangular cathode electrode arranged in a sputtering apparatus 3 shown in FIG. 3. A target 6 is fixed on the front of the sixth magnet unit 600 via a rear plate (not shown). In this case, the distance between the surface of the target 6 and that of the sixth magnet unit 600 is 14 mm. The target 6 is made of an FeCo alloy, which has a size of 130 mm×470 mm×3 mm (thickness).

Figure 19A:
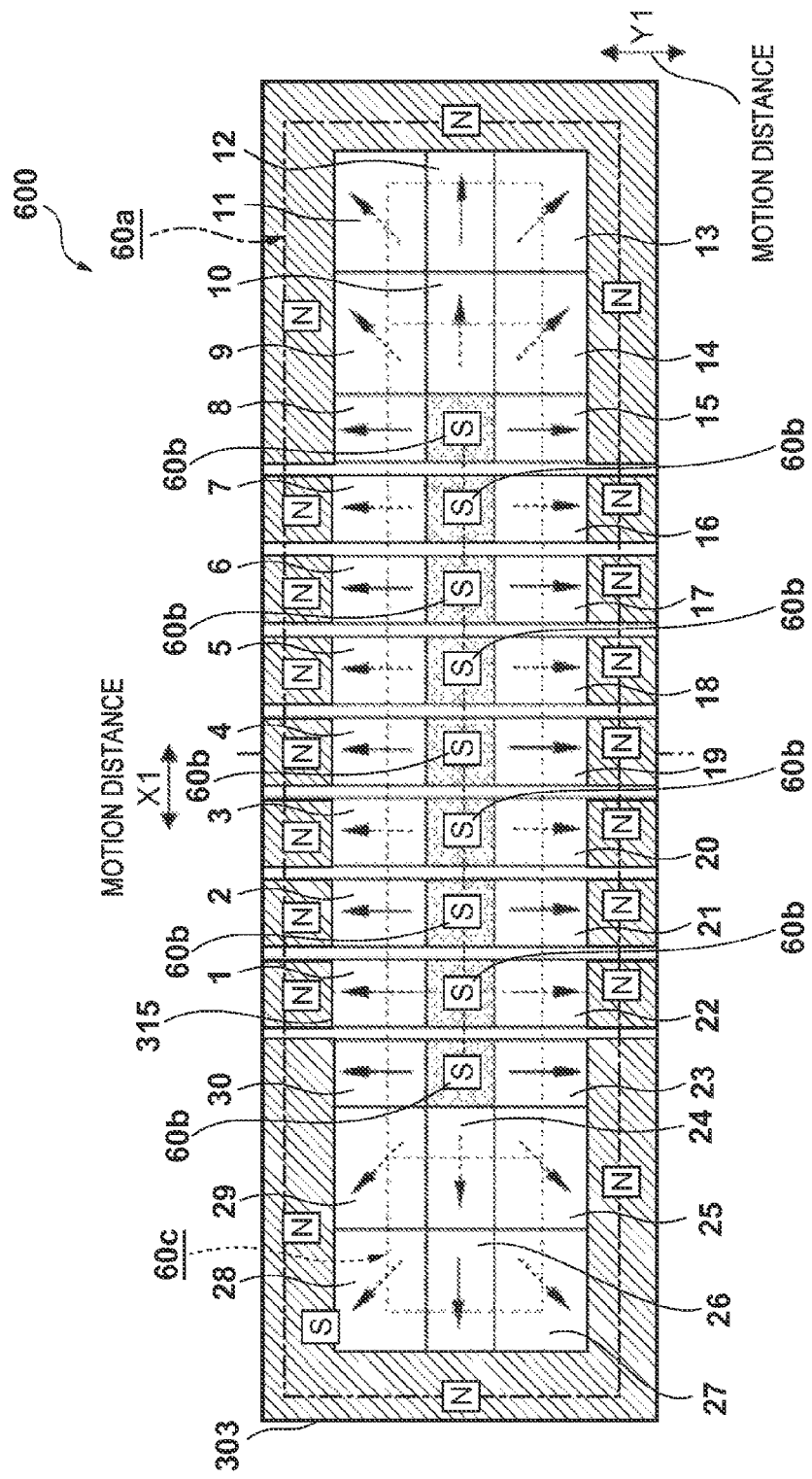
FIG. 19A is a schematic view showing a sixth magnet unit according to the present invention.
Figure 19B:
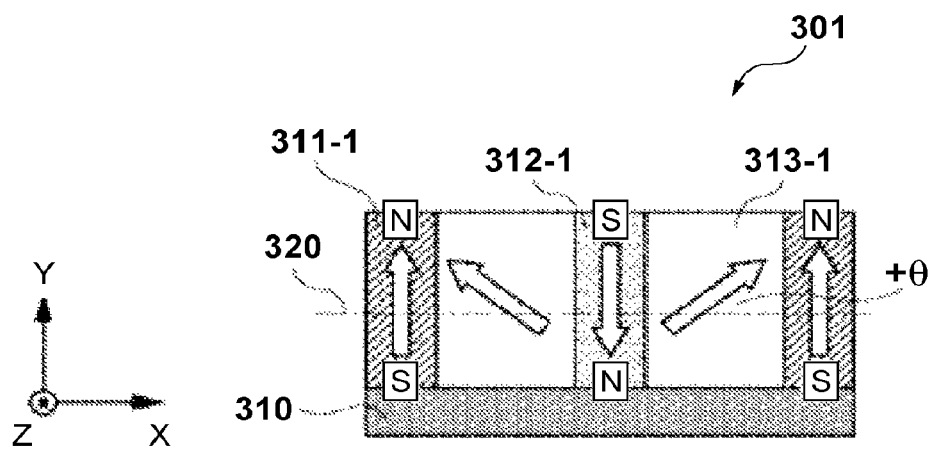
FIG. 19B is a schematic view showing a sixth magnet element according to the present invention.
Figure 19C:
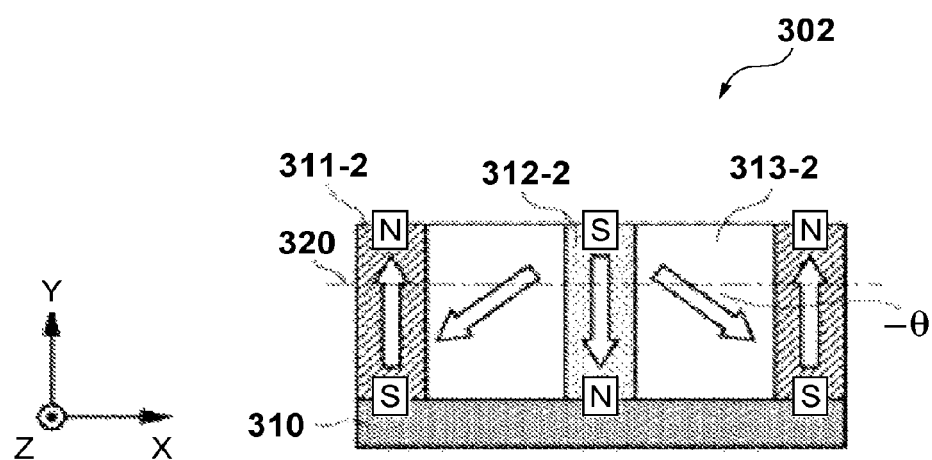
FIG. 19C is a schematic view showing a seventh magnet element according to the present invention.

The shape of the sixth magnet unit 600 is as shown in FIGS. 19A to 19C. A magnet used in the sixth magnet unit 600 is made of NdFeB which has a maximum energy product of 381 KJ/m$^3$ (48 MGOe). The unit 600 has a minor-axis length of 90 mm, a major-axis length of 430 mm, and a magnet-portion height of 35 mm.

The sixth magnet unit 600 is formed by a first magnet group 60*a* including a plurality of first magnet-group magnets arranged along the periphery of a rectangular magnetic plate (yoke plate) 310, a second magnet group 60*b* including a plurality of second magnet-group magnets arranged in the center portion of the rectangular magnetic plate (yoke plate) 310, and a third magnet group 60*c* including a plurality of third magnet-group magnets arranged between the first magnet group 60*a* and the second magnet group 60*b* to surround the second magnet group 60*b*. The first magnet-group magnets are provided to stand upright on the plate surface of the rectangular magnetic plate (yoke plate) 310 along the vertical direction, and have a 13th magnetic pole (S pole) on a surface facing the plate surface of the rectangular magnetic plate (yoke plate) 310 and a 14th magnetic pole (N pole) unlike the 13th magnetic pole (S pole) on a surface facing away from the plate surface of the rectangular magnetic plate (yoke plate) 310.

Referring to FIG. 19A, the first magnet-group magnets include a plurality of magnets each having the N pole in the x-axis direction. The first magnet-group magnets correspond to a 20th magnet 311-1 of a sixth magnet element 301, a 23rd magnet 311-2 of a seventh magnet element 302, and a magnets 303-1 or 303-2 of an eighth magnet element 303 (all of which will be described later). The second magnet-group magnets are provided to stand upright on the plate surface of the rectangular magnetic plate (yoke plate) 310 along the vertical direction, and have a 15th magnetic pole (N pole) unlike the 13th magnetic pole (S pole) on the surface facing the plate surface of the rectangular magnetic plate (yoke plate) 310 and a 16th magnetic pole (S pole) unlike the 14th magnetic pole (N pole) on the surface facing away from the plate surface of the yoke plate.

Referring to FIG. 19A, the second magnet-group magnets include a plurality of magnets each having the S pole in the x-axis direction. The second magnet-group magnets correspond to a 21st magnet 312-1 of the sixth magnet element 301 and a 24th magnet 312-2 of the seventh magnet element 302 (all of which will described later).

The third magnet-group magnets include the seventh magnet which is arranged to stand upright between the first magnet-group magnet and the second magnet-group magnet, has a 17th magnetic pole (N pole) in a portion facing the 14th magnetic pole (N pole) of the first magnet-group magnet (311-1) and an 18th magnetic pole (S pole) unlike the 17th magnetic pole (N pole) in a portion facing the 15th magnetic pole (N pole) of the second magnet-group magnet (312-1), and is magnetized so that a line which connects the 17th magnetic pole and the 18th magnetic pole is tilted with respect to the flat plate surface of the yoke, and the eighth magnet which is arranged to stand upright between the first magnet-group magnet and the second magnet-group magnet, has a 19th magnetic pole (N pole) in a portion facing the 13th magnetic pole (S pole) of the first magnet-group magnet (311-2) and a 20th magnetic pole (N pole) unlike the 19th magnetic pole (N pole) in a portion facing the 16th magnetic pole (S pole) of the second magnet-group magnet (312-2), and is magnetized so that a line which connects the 19th magnetic pole and the 20th magnetic pole is tilted with respect to the flat plate surface of the yoke. The seventh magnet corresponds to a 22nd magnet 313-1 of the sixth magnet element 301 (to be described later), and the eighth magnet corresponds to a 25th magnet 313-2 of the seventh magnet element 302 (to be described later). Referring to FIG. 19A, the third magnet-group magnets have magnetic lines of force from the second magnet-group magnets to the first magnet-group magnets. The third magnet-group magnets correspond to magnets 1 to 30 shown in FIG. 19A.

Two 20th magnets 311-1 or two 23rd magnets 311-2 in total are fixed on the short sides of the rectangular magnetic plate 310 of the sixth magnet element 301 or the seventh magnet element 302. In this Example, the 20th magnets 311-1 and the 23rd magnets 311-2 have N poles on the target side. The 21st magnet 312-1 or the 24th magnet 312-2 is fixed between the two 20th magnets 312-1 or the two 23rd magnets 311-2 to have S poles on the target side. Furthermore, two 22nd magnets 313-1 in total are symmetrically fixed on both the sides of the 21st magnet 312-1 of the sixth magnet element 301. Two 25th magnets 313-2 in total are symmetrically fixed on both the sides of the 24th magnet 312-2 of the seventh magnet element 302. The 22nd magnet 313-1 forms an angle θ in a direction from the N pole of the 21st magnet 312-1 to the N pole of the 20th magnet 311-1, that is, a direction which comes closer to the target 6 from a direction parallel to the surface of the magnetic plate 310. Consequently, in the 22nd magnet 313-1, a component parallel to the direction of the normal to the surface of the magnetic plate 310 is oriented in a direction opposite to that of the 21st magnet 311-1, that is, the angle θ is positive. On the other hand, the 25th magnet 313-2 forms an angle θ in a direction from the S pole of the 24th magnet 312-2 to the S pole of the 23rd magnet 311-2, that is, a direction from a direction parallel to the surface of the magnetic plate 310 to the rear surface of the magnetic plate 310. Consequently, in the 25th magnet 313-2, a component parallel to the direction of the normal to the surface of the magnetic plate 310 is oriented in the same direction as that of the 24th magnet 312-2, that is, the angle θ is negative. The 22nd magnets 313-1 of the sixth magnet element 301 or the 25th magnets 313-2 of the seventh magnet element 302 correspond to magnets 1 to 7 or magnets 16 to 22 shown in FIG. 19A. Referring to FIGS. 19B and 19C, a component, parallel to the magnetic plate 310, of the magnetic pole direction of the 22nd magnet 313-1 or 25th magnet 313-2 is oriented to the neighboring 20th magnet 311-1 or 23rd magnet 311-2. Note that a component, parallel to the magnetic plate 310, of the magnetic pole direction of the 22nd magnet 313-1 or 25th magnet 313-2 may be oriented to the 21st magnet 312-1 or 24th magnet 312-2.

Of magnets 1 to 7 and 16 to 22 shown in FIG. 19A, magnets 2, 4, 6, 17, 19, and 21 are included in the sixth magnet element 301 and magnets 1, 3, 5, 7, 16, 18, 20, and 22 are included in the seventh magnet element 302. Assume that γ represents a deflection angle with respect to an imaginary line, a perpendicular dropped to a side 315 shown in FIG. 19A. In this case, γ=0 for all the 22nd magnets 313-1 of the sixth magnet element 301 and the 25th magnets 313-2 of the seventh magnet element 302.

Figure 21:
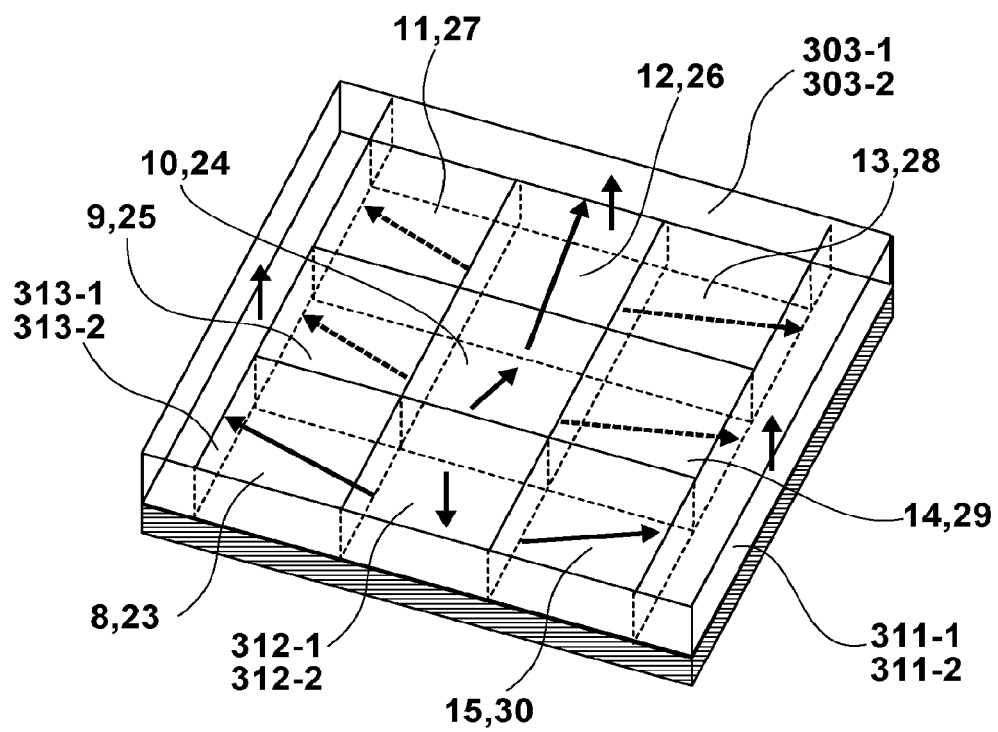
FIG. 21 is a perspective view showing the eighth magnet element according to the present invention.

The eighth magnet element 303 will be explained with reference to FIGS. 20A, 20B, and 21. FIGS. 20A and 20B are plan views showing the eighth magnet element. FIG. 21 is a perspective view showing the eighth magnet element. As shown in FIGS. 20A, 20B, and 21, the eighth magnet element 303 includes a U-shaped magnet (the magnet 303-1 or 303-2 and the magnets 311-1 or 311-2) having an N pole in the z-axis direction, an inner magnet (the magnet 312-1 or 312-2) having an S pole in the z-axis direction, and intermediate magnets (magnets 8 to 15 or 23 to 30) arranged between the U-shaped magnet and the inner magnet. The magnet 311-1 corresponds to the 20th magnet 311-1 of the sixth magnet element 301 and the magnet 311-2 corresponds to the 23rd magnet 311-2 of the seventh magnet element 302. The magnet 312-1 corresponds to the 21st magnet 312-1 of the sixth magnet element 301 and the magnet 312-2 corresponds to the 24th magnet 312-2 of the seventh magnet element 302. Magnets 8 and 15 or magnets 23 and 30 correspond to the 22nd magnets 313-1 of the sixth magnet element 301 or the 25th magnets 313-2 of the seventh magnet element 302. As described above, the eighth magnet element 303 includes magnets corresponding to magnets 8 to 15 and 23 to 30 shown in FIG. 19A. An angle γ of the magnetic pole direction will be described using imaginary lines 322 and 323 shown in FIG. 20B. The magnet 8 or 15 shown in FIG. 19A is defined by a deflection angle γ with respect to the imaginary line 323, which is 0° in this embodiment. Magnet 10 or 12 is defined by a deflection angle γ with respect to the imaginary line 322 shown in FIG. 20B, which is 0° in this embodiment. If magnet 9 or 11 shown in FIG. 19A is defined by the deflection angle γ with respect to the imaginary line 322 shown in FIG. 20B, the angle γ is positive, which is +45° in this embodiment. Similarly, magnet 30 or 23 shown in FIG. 19A is defined by the deflection angle γ with respect to the imaginary line 323, which is 0° in this embodiment. Magnet 24 or 26 is defined by the deflection angle γ with respect to the imaginary line 322 shown in FIG. 20B, which is 0° in this embodiment. If magnet 28 or 29 shown in FIG. 19A is defined by the deflection angle γ with respect to the imaginary line 322 shown in FIG. 20B, the angle γ is positive, which is +45° in this embodiment. If magnet 13 or 14 shown in FIG. 19A is defined by the deflection angle γ with respect to the imaginary line 322 shown in FIG. 20B, the angle γ is negative, which is −45° in this embodiment. Similarly, if magnet 25 or 27 shown in FIG. 19A is defined by the deflection angle γ with respect to the imaginary line 322 shown in FIG. 20B, the angle γ is negative, which is −45° in this embodiment. As described above, the angle γ is determined to obtain table 3. As a result, a line which connects one magnetic pole with the other magnetic pole of each of magnets (magnets 9, 11, 13, 14, 25, 27, 28, and 29) positioned at the corners of the rectangular magnetic plate (yoke plate) 310 forms an angle of 60° or smaller in the clockwise or counterclockwise direction with respect to the imaginary line 322 shown in FIG. 20B along the flat plate surface of the rectangular magnetic plate (yoke plate) 310. Table 3 below shows a positional relationship and the magnetic pole direction of each magnet element of the sixth magnet unit 600. Note that Nos. 1 to 30 in table 3 below represent the numbers given in the sixth magnet unit 600 shown in FIG. 19A. The directions and values of θ and γ shown in table 3 below are merely examples. For the same reason as that for FIGS. 6A and 6B described using a first magnet element 40, "−70°≤θ<10° or 10°<θ≤70°" and "−60°≤γ≤60°" are desirable.

TABLE 3

| No. | θ° | γ° |
|---|---|---|
| 1 | −45 | 0 |
| 2 | 45 | 0 |
| 3 | −45 | 0 |
| 4 | 45 | 0 |
| 5 | −45 | 0 |
| 6 | 45 | 0 |
| 7 | −45 | 0 |
| 8 | 45 | 0 |
| 9 | −45 | 45 |
| 10 | −45 | 0 |
| 11 | −45 | 45 |
| 12 | 70 | 0 |
| 13 | −45 | −45 |
| 14 | −45 | −45 |
| 15 | 45 | 0 |
| 16 | −45 | 0 |
| 17 | 45 | 0 |
| 18 | −45 | 0 |
| 19 | 45 | 0 |
| 20 | −45 | 0 |
| 21 | 45 | 0 |
| 22 | −45 | 0 |
| 23 | 45 | 0 |
| 24 | −45 | 0 |
| 25 | −45 | −45 |
| 26 | 70 | 0 |
| 27 | −45 | −45 |
| 28 | −45 | 45 |
| 29 | −45 | 45 |
| 30 | 45 | 0 |

FIG. 21 is a perspective view for easy understanding of the magnetization direction of each magnet of the eighth magnet element 303 shown in FIGS. 20A and 20B. Note that a combination of a shape and magnetization directions like the eighth magnet element 303 makes it possible to make an erosion track meandering on the both ends of the sixth magnet unit 600. This has an advantage that concentrated erosion on a portion of the target corresponding to the eighth magnet element 303 is prevented from proceeding by swinging the sixth magnet unit 600. Note that it is also possible to make an erosion track meandering on both the ends of the sixth magnet unit 600 using the fifth magnet element 60.

To examine the magnetic track on the target 6, a rectangular cathode electrode was provided in a magnetic field measurement device (not shown). A probe connected with the magnetic field measurement device was positioned at a height of 1.0 mm directly above the target, and scanned in the plane direction of the target 6 while keeping its height. In this case, scanning directions were the x and y directions in FIG. 19B and the value of a magnetic flux density was acquired in the x, y, and z directions. Note that a computer (not shown) controlled the scan operation and magnetic flux density value acquisition of the probe.

As a result of extracting a region where components (composite components in the x and y directions=(x2+y2)½) of the obtained magnetic flux density, which were parallel to the surface of the target and had a value of 50 mT or larger, and points at which components, parallel to the normal to the surface of the target, of the obtained magnetic flux density were zero, that is, a magnetic track, it was found that a magnetic track 330 had a wave shape as shown in FIG. 22A. Note that if components, parallel to the surface of the target, of the magnetic flux density on the magnetic track have a value of 50 mT or larger, a stable electric discharge is possible (a region 331). It is found from this result that it is possible to obtain, by using the present invention, a magnetic field strength with which a stable electric discharge is possible while obtaining the wavy magnetic track.

The sixth magnet unit 600 was attached to the rectangular cathode electrode, and was caused to discharge while being swung parallel to the surface of the target 6, thereby performing sputtering deposition. The unit 600 was moved, in a rectangle, by a swing distance of ±20 mm in X1 and Y1 directions shown in FIG. 19A. When examining erosion distributions on the target 6 at section lines 332 and 333 after using 60 kWh, a result shown in FIGS. 22B and 22C was obtained. A section of an erosion portion presents a shape obtained by arranging a plurality of peaks and valleys, thereby increasing the use efficiency of the target.

Comparative Example 2

To ensure that the present invention is effective for a rectangular magnet unit, Comparative Example 2 in which a conventional magnet element is used will be described. A magnet unit 400 (to be referred to as "Comparative Example 2 magnet unit" hereinafter) according to Comparative Example 2 has an arrangement shown in FIGS. 23A and 23B. A magnet used in the Comparative Example 2 magnet unit is also made of NdFeB which has a maximum energy product of 381 KJ/m³ (48 MGOe). The Comparative Example 2 magnet unit has a minor-axis length of 90 mm, a major-axis length of 430 mm, and a magnet-portion height of 35 mm. SS400 with a thickness of 12 mm is used as a magnetic plate serving as a yoke plate.

Figure 24A:
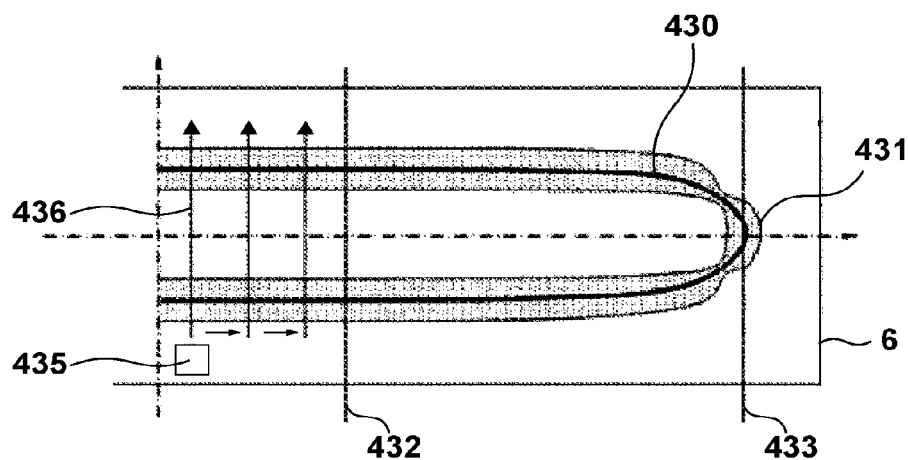
FIG. 24A is a schematic view showing a result of extracting a magnetic track by the Comparative Example 2 magnet unit.

A target 6 is fixed on the front of the Comparative Example 2 magnet unit via a rear plate (not shown) (FIG. 24A). In this case, a distance d between the surface of the target 6 and that of the Comparative Example 2 magnet unit is 14 mm. The target 6 is made of an FeCo alloy, which has a size of 130 mm×470 mm×3 mm (thickness).

To examine a magnetic track on the target 6, a rectangular cathode electrode 60 was provided in a magnetic field measurement device (not shown). A probe 435 connected with the magnetic field measurement device was positioned at a height of 1.0 mm directly above the target, and scanned in the plane direction (scanning direction 436) of the target 6 while keeping its height (FIG. 24A). In this case, scanning directions were the x and y directions in FIGS. 23A and 23B, and the value of a magnetic flux density was acquired in the x, y, and z directions. Note that a computer (not shown)

controlled the scan operation and magnetic flux density value acquisition of the probe.

Figure 24B:
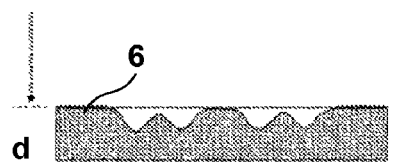
FIGS. 24B and 24C are schematic views showing a result of examining an erosion distribution on a target by the Comparative Example 2 magnet unit.
Figure 24C:
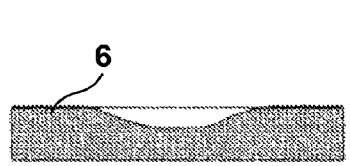
Figure 24C:
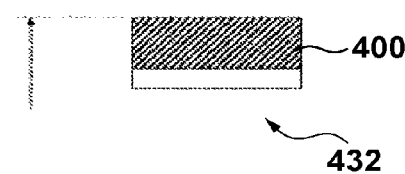
Figure 24C:
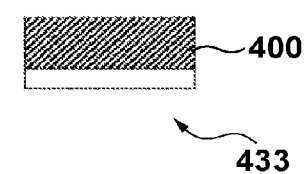
Figure 25:
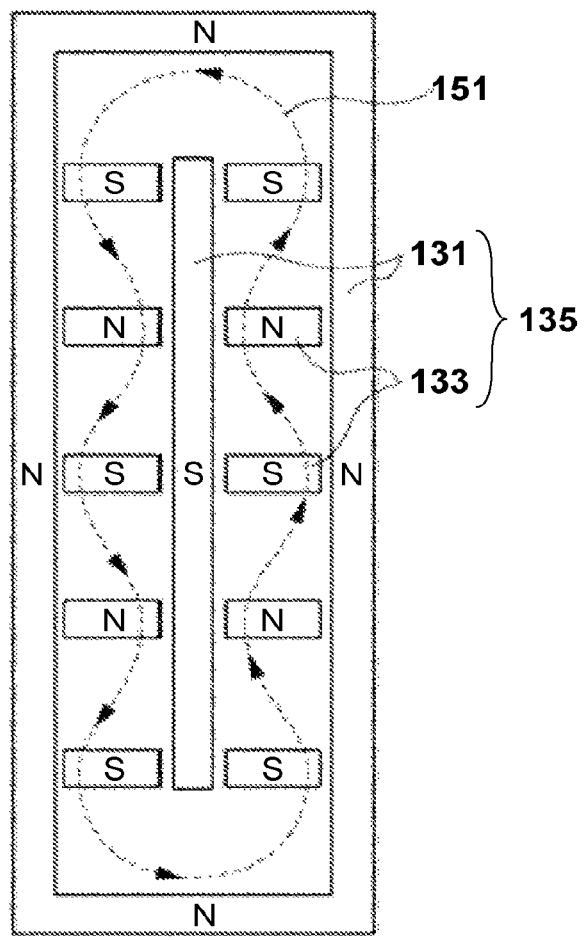
FIG. 25 is a plan view showing an arrangement example of a magnet unit according to the prior art (Japanese Patent Laid-Open No. 63-317671)
Figure 26:
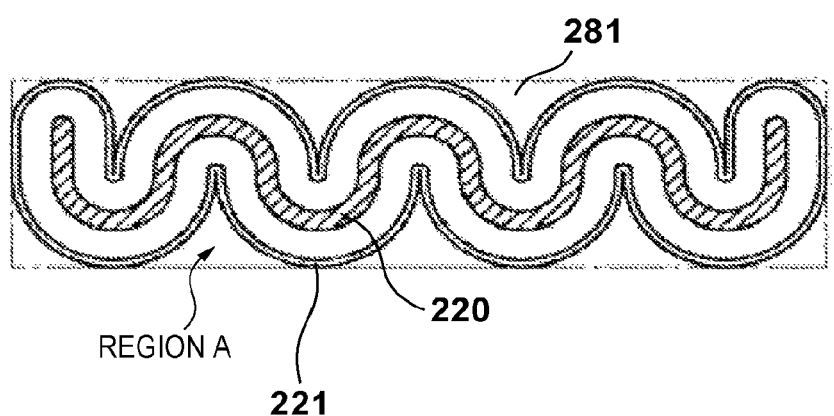
FIG. 26 is a horizontal sectional view showing an arrangement example of a magnet unit according to the prior art (Japanese Patent Laid-Open No. 2001-348663)

A result shown in FIGS. 24B and 24C was obtained by extracting a region (region 431) in which components (composite components in the x and y directions=$(x2+y2)^{1/2}$) of the obtained magnetic flux density, which were parallel to the surface of the target and had a value of 50 mT or larger, and points at which components, parallel to the normal to the surface of the target, of the obtained magnetic flux density were zero, that is, a magnetic track 430.

The Comparative Example 2 magnet unit was attached to a rectangular cathode electrode, and was caused to discharge while being swung parallel to the surface of the target 6, thereby performing sputtering deposition. Note that the magnet unit was moved, in a rectangle, by a swing distance of ±20 mm in X1 and Y1 directions shown in FIG. 19A. When examining erosion distributions on the target 6 at section lines 432 and 433 after using 40 kWh, a result shown in FIGS. 24B and 24C was obtained. By comparing FIGS. 24B and 24C with FIGS. 22B and 22C, it was found that an erosion region decreases.

It was found from the above result that the present invention is effective regardless of a cathode shape or target material.

Other Embodiments

Aspects of the present invention can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (e.g., computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-291235, filed Dec. 27, 2010, and Patent Application No. 2011-205736, filed Sep. 21, 2011, which are hereby incorporated by reference herein in their entirety.

What is claimed is:

1. A magnet unit which is arranged on a rear surface of a cathode electrode supporting a target and which includes a yoke plate which is made of an antiferromagnetic plate material and is arranged on the rear surface of the cathode electrode, the magnet unit comprising:
   a first magnet element consisting of:
   (a) a first magnet which is provided to stand upright on a plate surface of the yoke plate along a vertical direction and is configured to consist of a first magnetic pole on a surface facing the plate surface of the yoke plate and a second magnetic pole having a polarity opposite to a polarity of the first magnetic pole on a surface facing away from the plate surface of the yoke plate,
   (b) a second magnet which is provided to stand upright on the plate surface of the yoke plate along the vertical direction and is configured to consist of a third magnetic pole having a polarity opposite to the polarity of the first magnetic pole on a surface facing the plate surface of the yoke plate and a fourth magnetic pole having a polarity opposite to a polarity of the second magnetic pole on a surface facing away from the plate surface of the yoke plate, and
   (c) a third magnet, which is arranged to stand upright between the first magnet and the second magnet and is configured to consist of a fifth magnetic pole in a portion facing the second magnetic pole of the first magnet and a sixth magnetic pole having a polarity opposite to a polarity of the fifth magnetic pole on a portion facing the third magnetic pole of the second magnet, and is magnetized so that a line which connects the fifth magnetic pole and the sixth magnetic pole is diagonally oriented with respect to a surface parallel to the plate surface of the yoke plate; and
   a second magnet element consisting of:
   (d) a fourth magnet which is provided to stand upright on a plate surface of the yoke plate along a vertical direction and is configured to consist of a seventh magnetic pole on a surface facing the plate surface of the yoke plate and an eighth magnetic pole having a polarity opposite to a polarity of the seventh magnetic pole on a surface facing away from the plate surface of the yoke plate,
   (e) a fifth magnet, which is provided to stand upright on the plate surface of the yoke plate along the vertical direction and is configured to consist of a ninth magnetic pole having a polarity opposite to a polarity of the seventh magnetic pole on a surface facing the plate surface of the yoke plate and a tenth magnetic pole having a polarity opposite to a polarity of the eighth magnetic pole on a surface facing away from the plate surface of the yoke plate, and
   (f) a sixth magnet, which is arranged to stand upright between the fourth magnet and the fifth magnet and is configured to consist of an eleventh magnetic pole in a portion facing the seventh magnetic pole of the fourth magnet and a twelfth magnetic pole having a polarity opposite to a polarity of the eleventh magnetic pole in a portion facing the tenth magnetic pole of the fifth magnet, and is magnetized so that a line which connects the eleventh magnetic pole and the twelfth magnetic pole is tilted with respect to a surface parallel to the plate surface of the yoke plate,
   wherein in an arrangement of the first magnet element and the second magnet element, the first magnet is arranged to be adjacent to the fourth magnet, the second magnet is arranged to be adjacent to the fifth magnet, and the third magnet is arranged to be adjacent to the sixth magnet, and
   wherein the first magnet element and the second magnet element, which are alternately arranged, are arranged radially so that one end of the first magnet element and one end of the second magnet element are directed toward an end portion of the target, and the other end of the first magnet element and the other end of the second magnet element are directed toward a center portion of the target.

2. The magnet unit according to claim 1, wherein the line which connects the fifth magnetic pole and the sixth magnetic pole of the third magnet inclines, by an angle falling within a range from 10° to 70°, in a tilt direction with respect to the plate surface of the yoke plate and the tilt direction is oriented from the yoke plate to the target.

3. The magnet unit according to claim 1, wherein the line which connects the eleventh magnetic pole and the twelfth magnetic pole of the sixth magnet inclines, by an angle falling within a range from 10° to 70°, in a tilt direction with respect to the plate surface of the yoke plate, and the tilt direction is oriented from the target to the yoke plate.

4. The magnet unit according to claim 2, wherein the line which connects the fifth magnetic pole and the sixth magnetic pole of the third magnet forms an angle not larger than 60° in a clockwise direction with respect to a line which connects the second magnetic pole of the first magnet and the fourth magnetic pole of the second magnet along the plate surface of the yoke plate.

5. The magnet unit according to claim 3, wherein the line which connects the eleventh magnetic pole and the twelfth magnetic pole of the sixth magnet forms an angle not larger than 60° in a counterclockwise direction with respect to a line which connects the eighth magnetic pole of the fourth magnet and the tenth magnetic pole of the fifth magnet along the plate surface of the yoke plate.

6. The magnet unit according to claim 1, wherein said first magnet element and said second magnet element are alternately arranged at a predetermined interval.

7. The magnet unit according to claim 1, wherein said first magnet element and said second magnet element are alternately arranged in a circle.

8. A magnetron sputtering apparatus comprising:
a stage capable of supporting a substrate to be processed;
a magnet unit which is arranged on a rear surface of a cathode electrode supporting a target and which includes a yoke plate which is made of an antiferromagnetic plate material and is arranged on the rear surface of the cathode electrode; and
a transport mechanism for transporting the stage to a front of the target,
wherein the cathode electrode is arranged to face the stage and is supplied with a discharge power,
the magnet unit comprising:
a first magnet element consisting of:
  (a) a first magnet which is provided to stand upright on a plate surface of the yoke plate along a vertical direction and is configured to consist of a first magnetic pole on a surface facing the plate surface of the yoke plate and a second magnetic pole having a polarity opposite to a polarity of the first magnetic pole on a surface facing away from the plate surface of the yoke plate,
  (b) a second magnet which is provided to stand upright on the plate surface of the yoke plate along the vertical direction and is configured to consist of a third magnetic pole having a polarity opposite to the polarity of the first magnetic pole on a surface facing the plate surface of the yoke plate and a fourth magnetic pole having a polarity opposite to a polarity of the second magnetic pole on a surface facing away from the plate surface of the yoke plate, and
  (c) a third magnet, which is arranged to stand upright between the first magnet and the second magnet and is configured to consist of a fifth magnetic pole in a portion facing the second magnetic pole of the first magnet and a sixth magnetic pole having a polarity opposite to a polarity of the fifth magnetic pole on a portion facing the third magnetic pole of the second magnet, and is magnetized so that a line which connects the fifth magnetic pole and the sixth magnetic pole is diagonally oriented with respect to a surface parallel to the plate surface of the yoke plate; and
a second magnet element consisting of:
  (d) a fourth magnet which is provided to stand upright on a plate surface of the yoke plate along a vertical direction and is configured to consist of a seventh magnetic pole on a surface facing the plate surface of the yoke plate and an eighth magnetic pole having a polarity opposite to a polarity of the seventh magnetic pole on a surface facing away from the plate surface of the yoke plate,
  (e) a fifth magnet, which is provided to stand upright on the plate surface of the yoke plate along the vertical direction and is configured to consist of a ninth magnetic pole having a polarity opposite to a polarity of the seventh magnetic pole on a surface facing the plate surface of the yoke plate and a tenth magnetic pole having a polarity opposite to a polarity of the eighth magnetic pole on a surface facing away from the plate surface of the yoke plate, and
  (f) a sixth magnet, which is arranged to stand upright between the fourth magnet and the fifth magnet and is configured to consist of an eleventh magnetic pole in a portion facing the seventh magnetic pole of the fourth magnet and a twelfth magnetic pole having a polarity opposite to a polarity of the eleventh magnetic pole in a portion facing the tenth magnetic pole of the fifth magnet, and is magnetized so that a line which connects the eleventh magnetic pole and the twelfth magnetic pole is tilted with respect to a surface parallel to the plate surface of the yoke plate,
wherein in an arrangement of the first magnet element and the second magnet element, the first magnet is arranged to be adjacent to the fourth magnet, the second magnet is arranged to be adjacent to the fifth magnet, and the third magnet is arranged to be adjacent to the sixth magnet, and
wherein the first magnet element and the second magnet element, which are alternately arranged, are arranged radially so that one end of the first magnet element and one end of the second magnet element are directed toward an end portion of the target, and the other end of the first magnet element and the other end of the second magnet element are directed toward a center portion of the target.

* * * * *